United States Patent
Kawanishi

(10) Patent No.: US 6,528,866 B2
(45) Date of Patent: Mar. 4, 2003

(54) HIGH-FREQUENCY MODULE

(75) Inventor: Masato Kawanishi, Hibikino (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/934,559

(22) Filed: Aug. 23, 2001

(65) Prior Publication Data

US 2002/0028530 A1 Mar. 7, 2002

(30) Foreign Application Priority Data

Sep. 7, 2000 (JP) .......................................... 2000-271804

(51) Int. Cl.⁷ ............................................... H01L 23/552
(52) U.S. Cl. ............................ 257/659; 257/660; 331/67
(58) Field of Search ............................... 257/508, 538, 257/659, 723, 724, 725; 438/308, 379; 331/67

(56) References Cited

U.S. PATENT DOCUMENTS

| | | | |
|---|---|---|---|
| 5,172,077 A | * 12/1992 | Funada | 331/67 |
| 5,661,441 A | * 8/1997 | Morino et al. | 331/67 |
| 5,898,344 A | * 4/1999 | Hayashi | 331/37 |
| 6,016,090 A | * 1/2000 | Iio et al. | 333/202 |

FOREIGN PATENT DOCUMENTS

| | | |
|---|---|---|
| JP | 2616280 | 3/1997 |
| JP | A118668 | 1/1999 |
| JP | 2938820 | 6/1999 |

* cited by examiner

*Primary Examiner*—David Nelms
*Assistant Examiner*—Dung Anh Le
(74) *Attorney, Agent, or Firm*—Birch, Stewart, Kolasch & Birch, LLP

(57) ABSTRACT

In a high-frequency module according to the present invention in which a conductive cap for an electromagnetic purpose is placed on a substrate on which a plurality of electrical components are mounted by soldering, an insulating adhesive is applied between the plurality of electrical components. Since the insulating adhesive is applied between the electrical components on the substrate, it is possible to prevent such deficiencies as "solder touch" between components due to self-alignment which is caused by a solder which melts in the reflow process. As a result, a highly reliable high-frequency module can be obtained, and the number of application points of the insulating adhesive can be reduced.

16 Claims, 19 Drawing Sheets

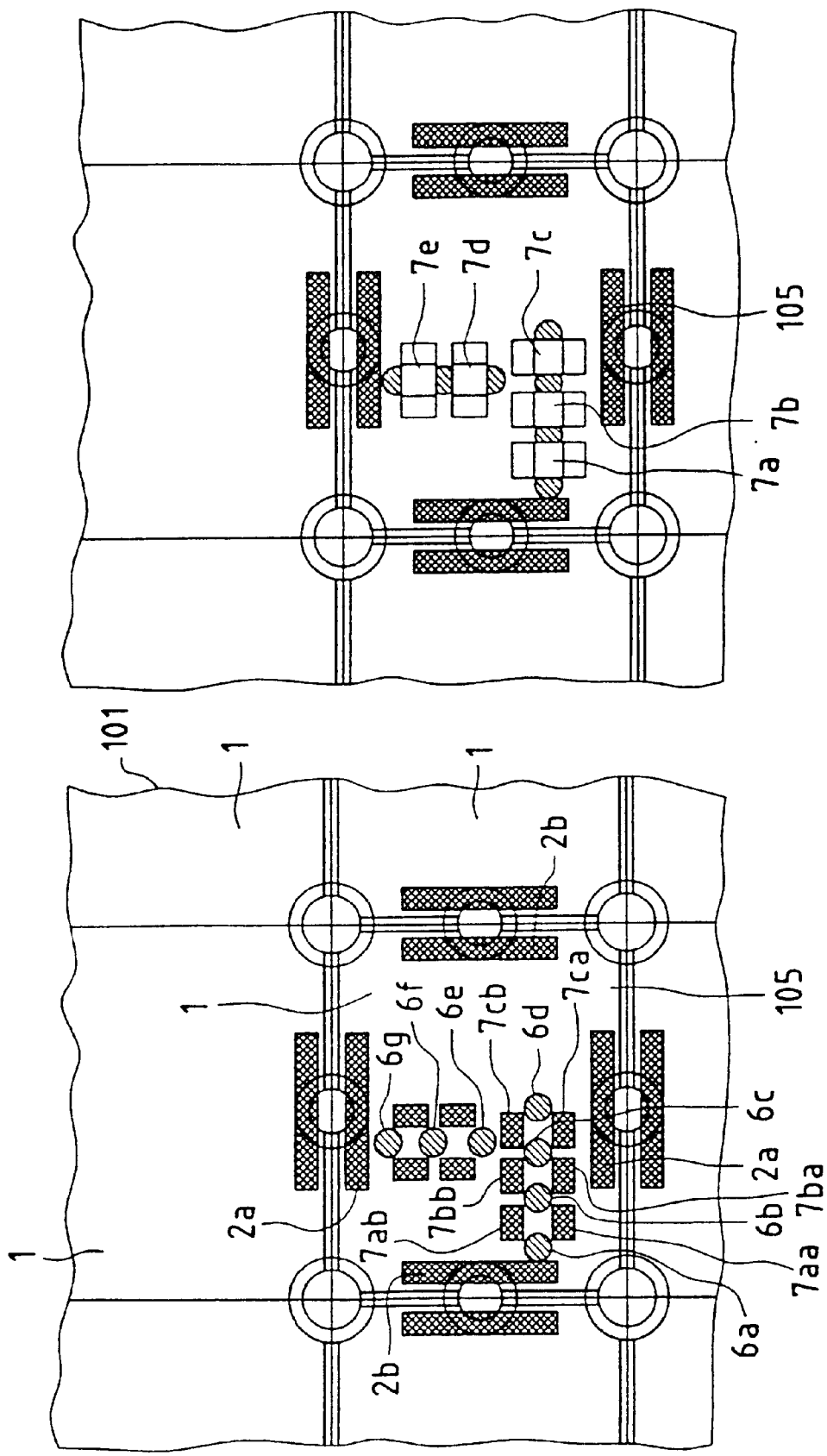

FIG.3(a)
FIG.3(c)
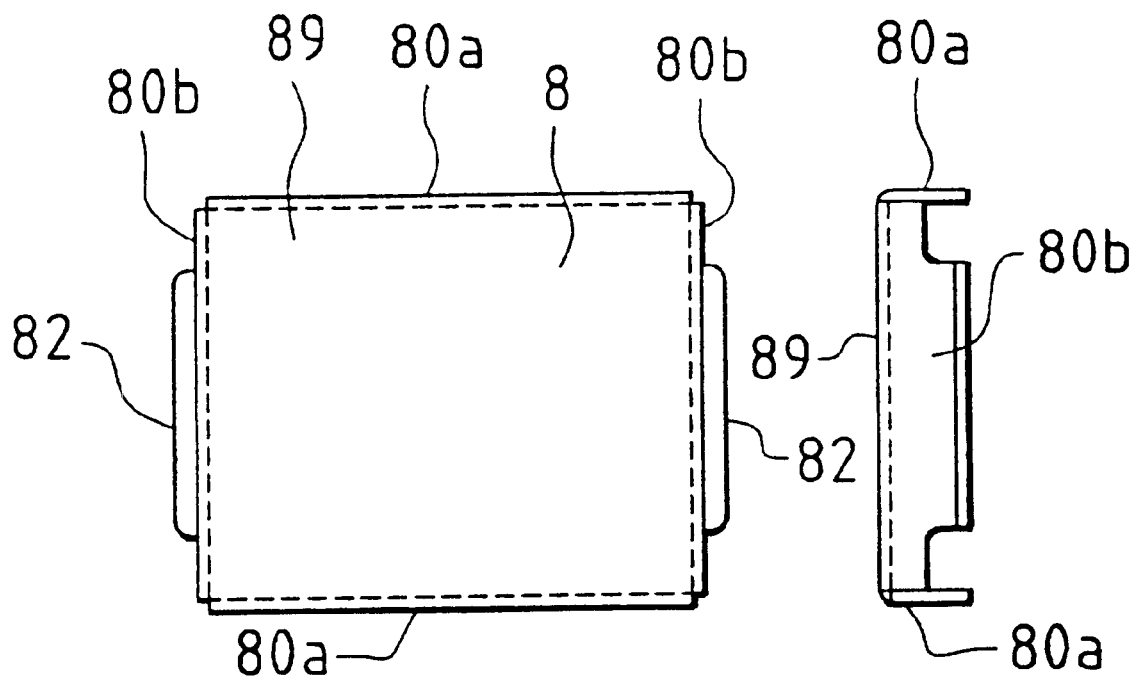
FIG.3(b)
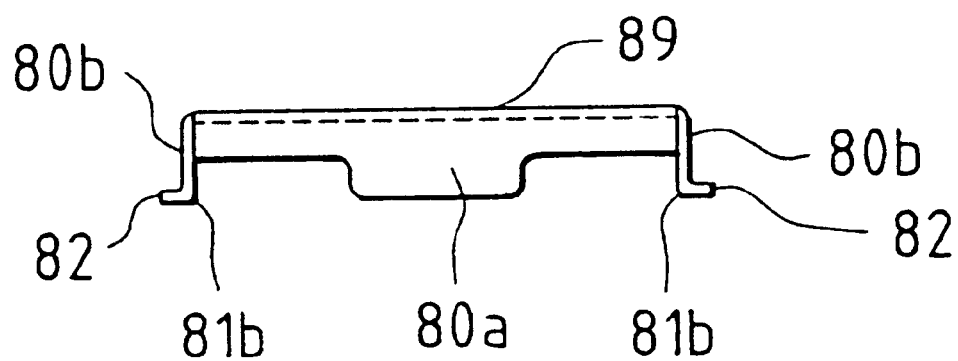

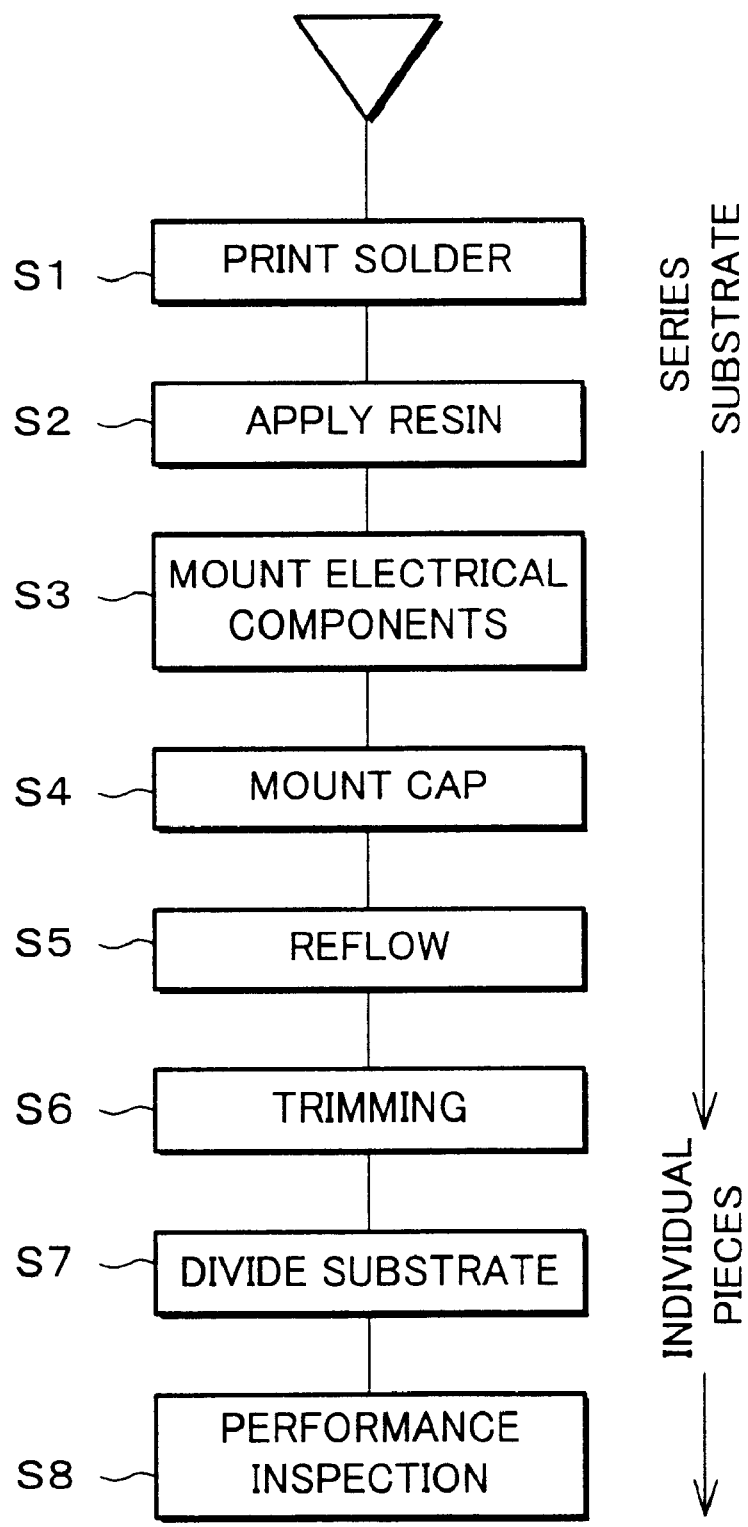

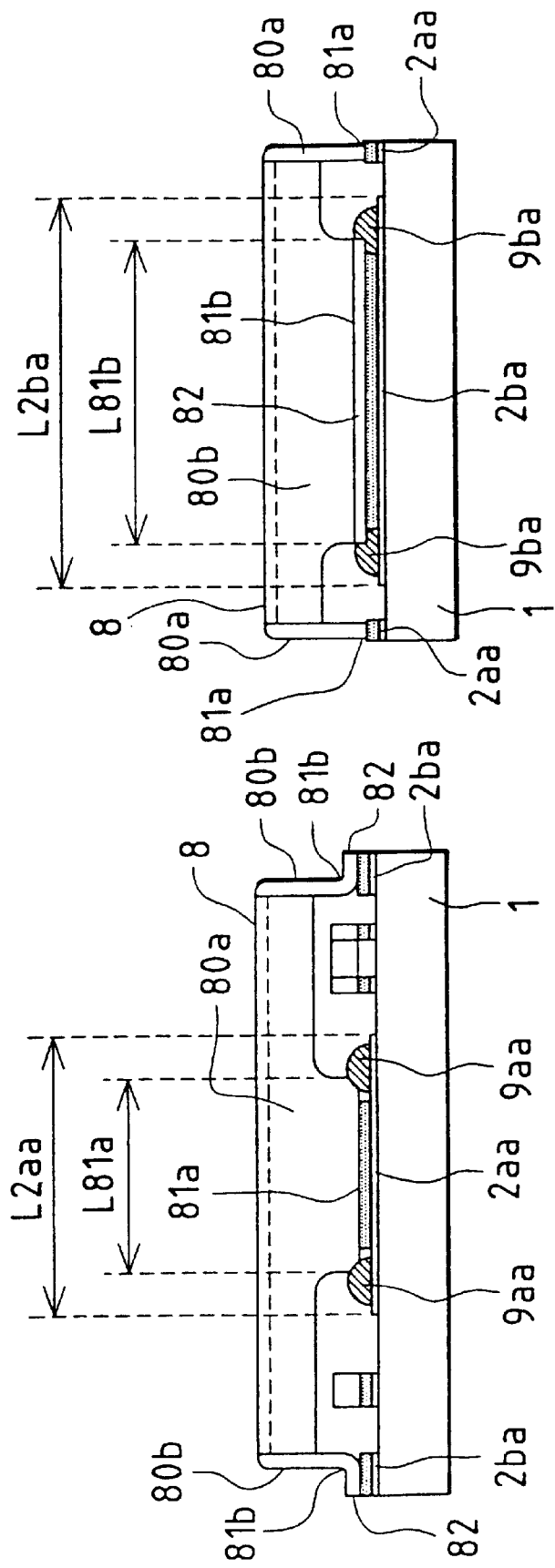

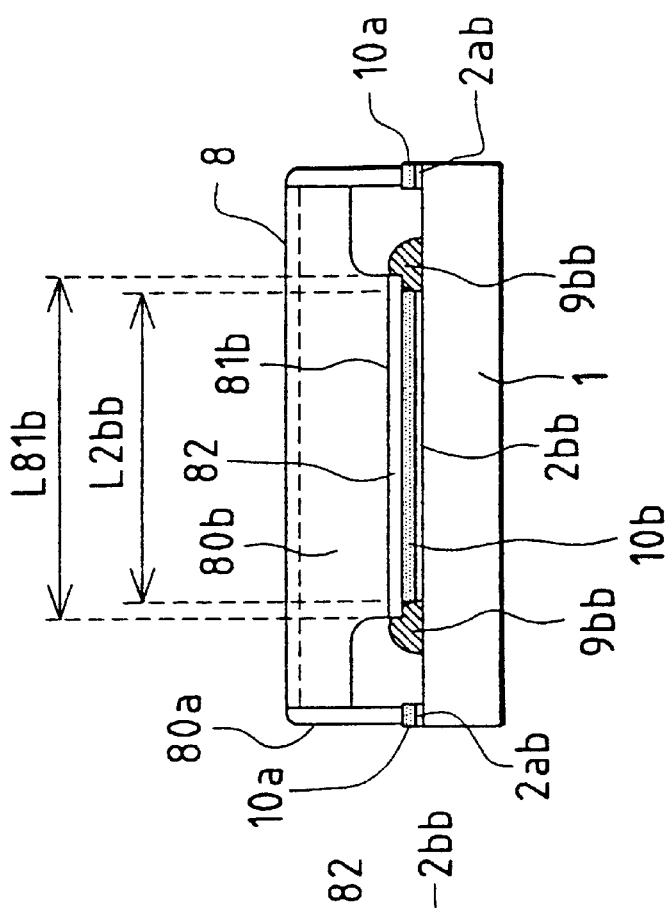
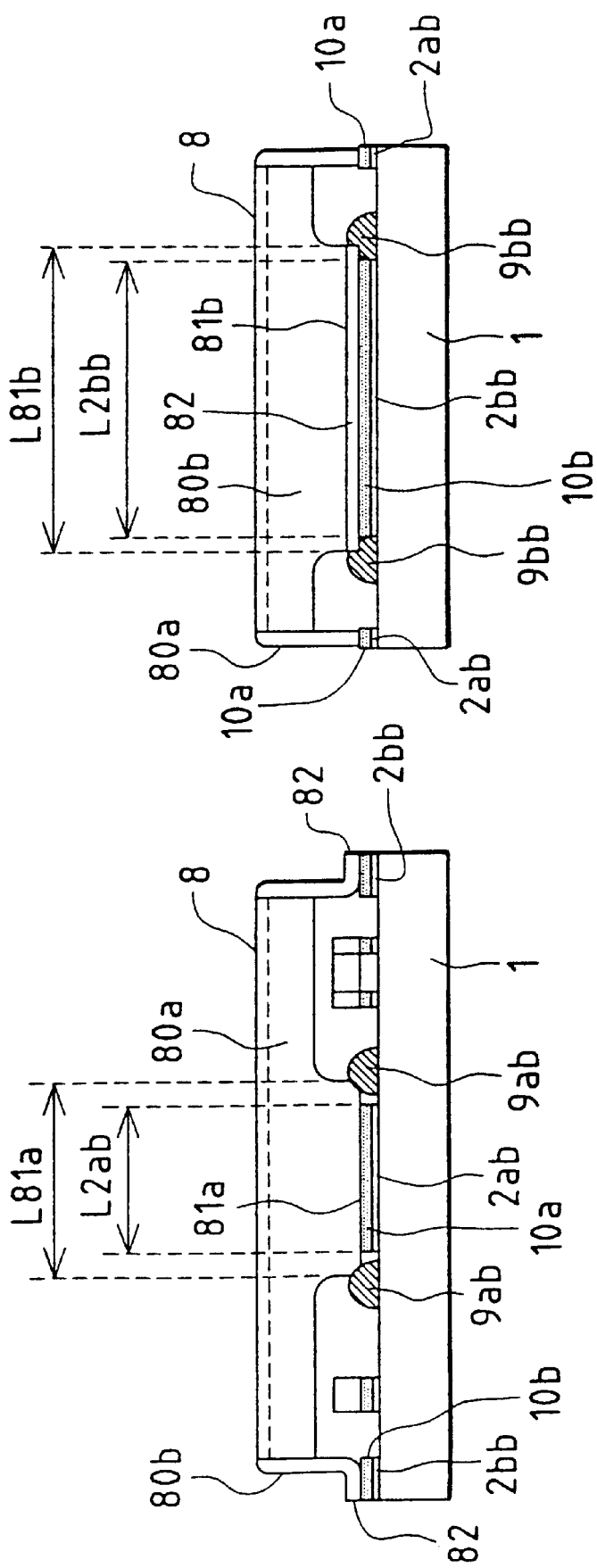

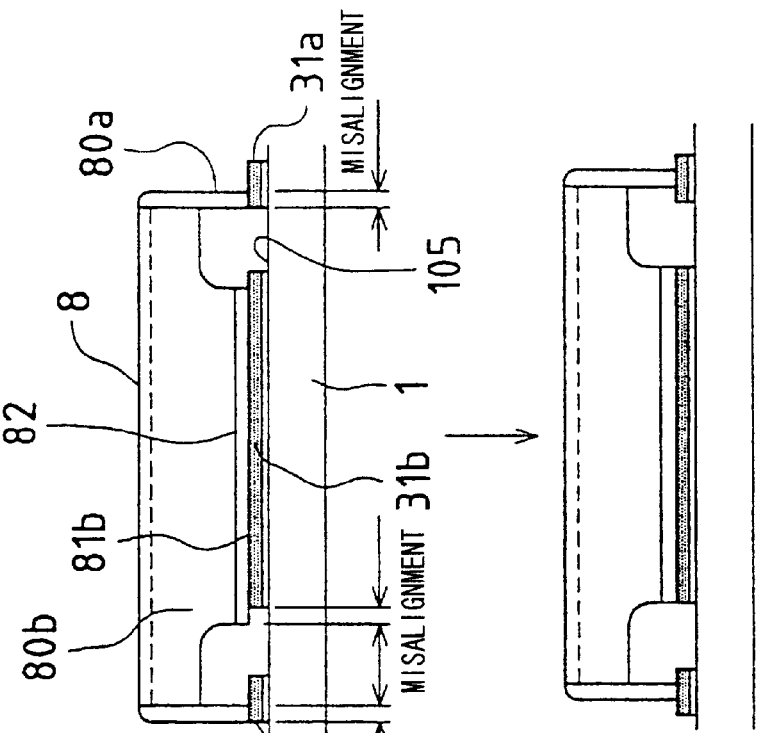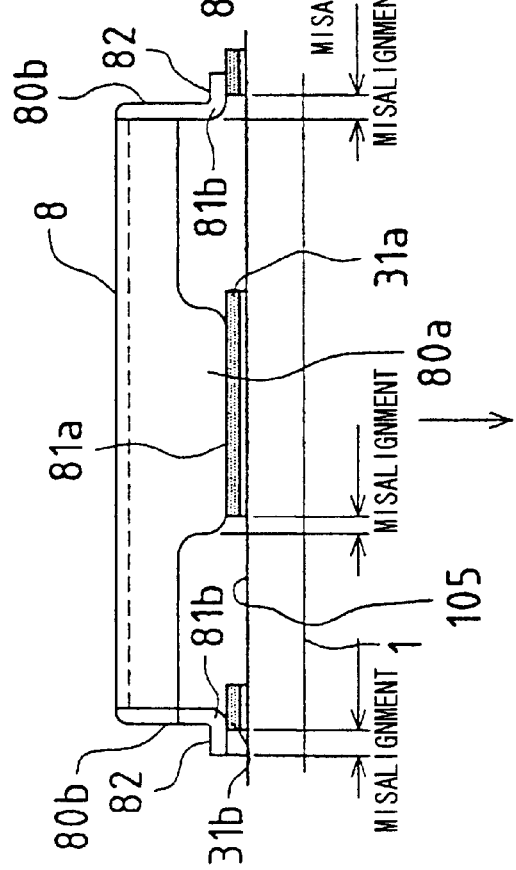

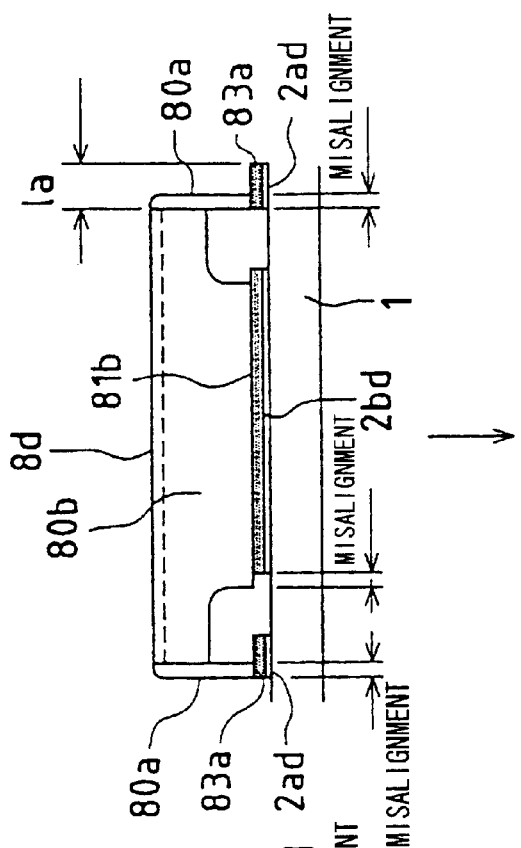
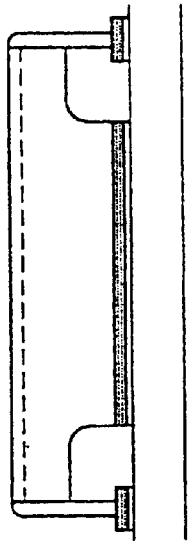
FIG. 11 (a)
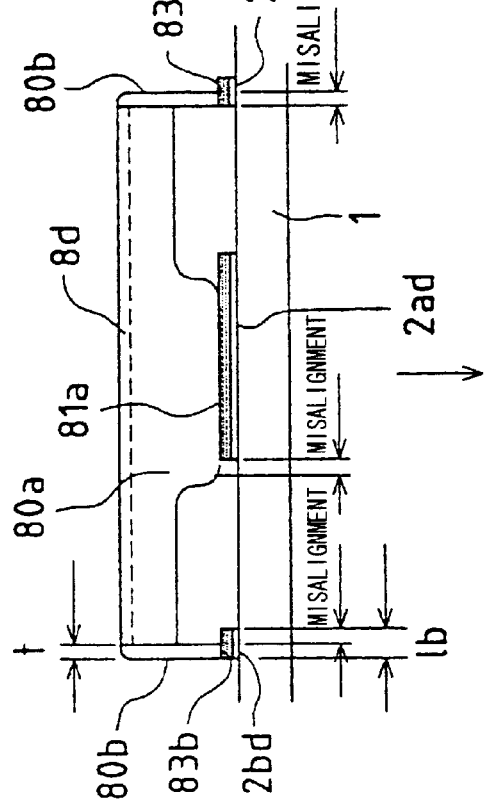
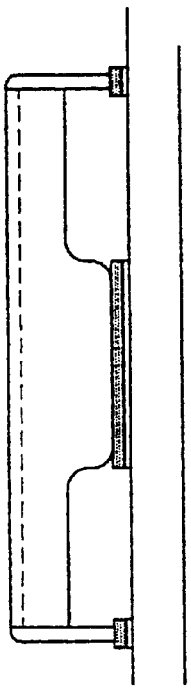
FIG. 11 (b)

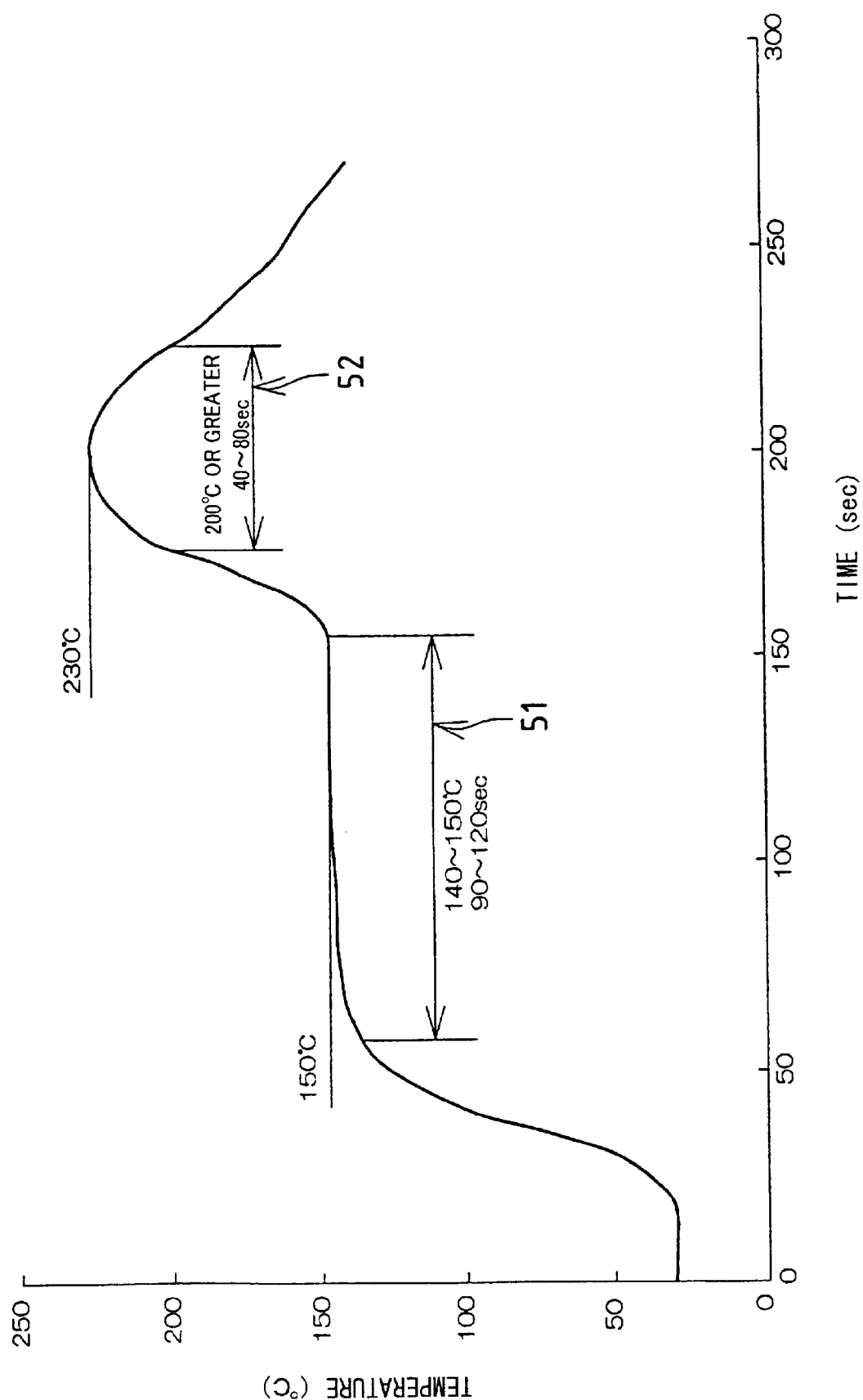

FIG. 18 (a)
SERIES SUBSTRATE
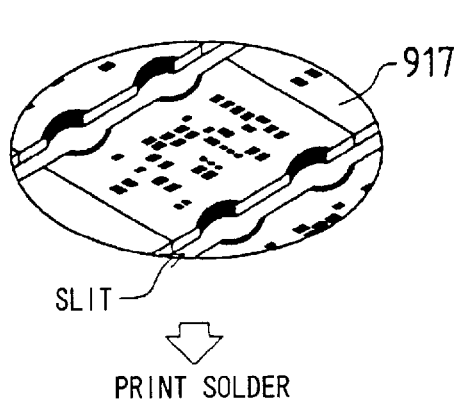
⇩ PRINT SOLDER
FIG. 18 (b)
MOUNT ELECTRICAL COMPONENTS ON SERIES SUBSTRATE
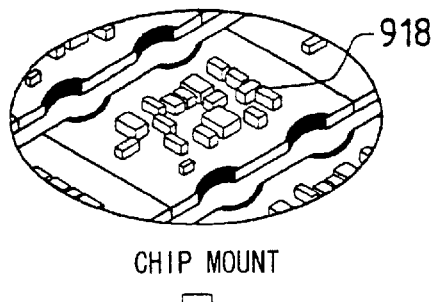
⇩ CHIP MOUNT
FIG. 18 (c)
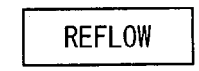
⇩
FIG. 18 (d)
DIVIDE INTO INDIVIDUAL PIECES BY DICING
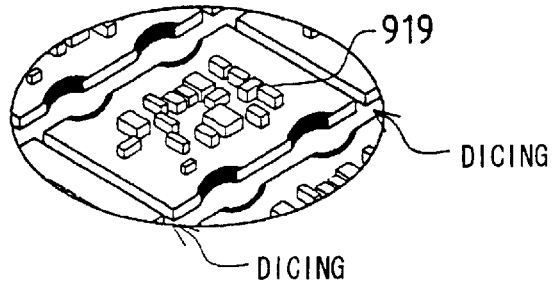
FIG. 18 (e)
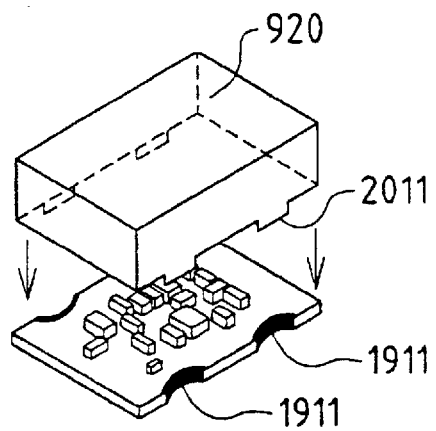
⇩
FIG. 18 (f)
· LASER TRIMMING
· ELECTRICAL CHARACTERISTICS INSPECTION
⇩
FIG. 18 (g)
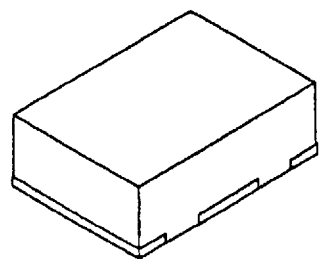

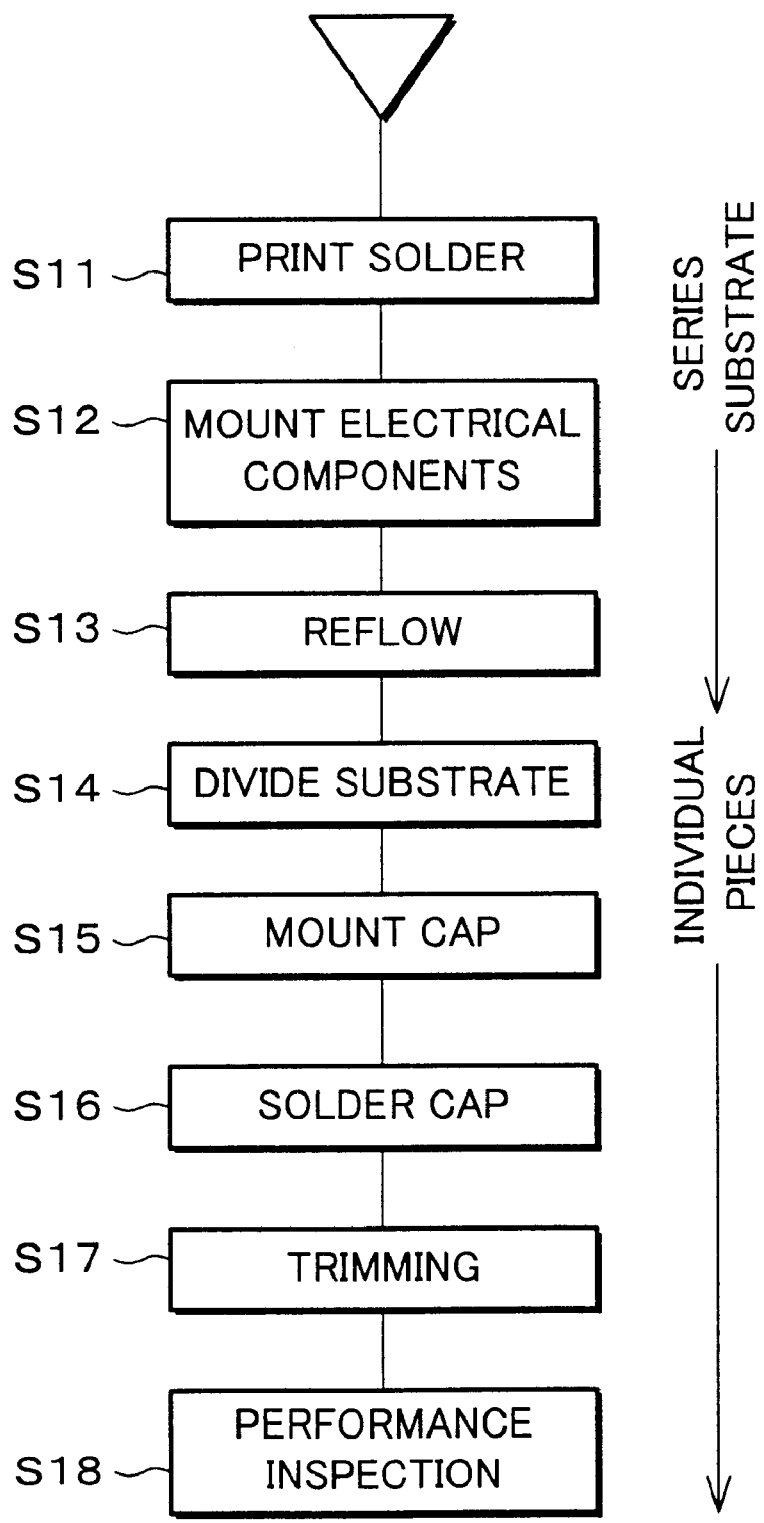

HIGH-FREQUENCY MODULE

FIELD OF THE INVENTION

The present invention relates to a high-frequency module having a conductive cap for electromagnetically shielding a substrate and electrical components from each other, and to a manufacturing method of such a high-frequency module.

BACKGROUND OF THE INVENTION

One example of conventional high-frequency modules can be found in Japanese Unexamined Patent Publication No. 8668/1999 (Tokukaihei 11-8668) (Publication date: Jan. 12, 1999). The high-frequency module (portable phone) disclosed in this publication is manufactured by a manufacturing process as shown in FIG. 18(a) through FIG. 18(e), and the product module is as shown in FIG. 18(g).

As shown in FIG. 18(a), a series substrate 917 is divided into a plurality of substrate areas. Also, as shown in FIG. 18(b), electrical components 918 make up a high-frequency circuit section. Further, a substrate 919 which is divided as shown in FIG. 18(d) is electromagnetically shielded, together with the electrical components 918, by a conductive cap 920, as shown in FIG. 18(e).

More specifically, as shown in FIG. 18(a), a solder paste is applied to a predetermined position in each area of the series substrate 917. Then, as shown in FIG. 18 (b), the electrical components 918 are placed on the solder paste thus applied. The solder paste is then melted in a reflow vessel. As a result, the electrical components 918 are electrically connected to one another via a pattern (not shown) which is formed in each area, thus forming the high-frequency circuit section in each area. Thereafter, as shown in FIG. 18(d), the series substrate 917 is divided into individual substrates 919 by dicing. Then, as shown in FIG. 18 (e), a conductive cap 920 having projections 2011 which correspond to depressions 1911 is mounted on the substrate 919. The projections 2011 are electrically connected by soldering to a metal film which is formed on the depressions 1911 and to be ground electrodes. The product as shown in FIG. 18(g) is obtained after laser trimming which is performed to adjust frequency, followed by an electrical characteristics inspection.

However, the high-frequency module of the foregoing prior art had the following problems.

That is, as shown in FIG. 19, in steps S11 through S13, the substrates 919 are provided in the form of the series substrate 917 which is yet to be divided into individual pieces, and the electrical components 918 are soldered to the substrates 919 in this state.

Meanwhile, in steps S15 through S18, the substrates 919 are provided by being divided into individual pieces. That is, S15 for mounting the cap 920 on the substrate 919, S16 for soldering the cap 920 to the substrate 919, and S17 for performing trimming are all carried out with respect to the divided individual substrate 919.

That is, the process of mounting and soldering the cap 920, and the process of trimming are repeated for each piece of the substrate 919. Accordingly, the process of mounting and soldering the cap 920, and the process of trimming need to be repeated many times. Further, automation of manufacturing steps for the divided substrates 919 requires a vast investment. It was therefore difficult to reduce the cost of the high-frequency modules.

Further, in order to meet the demand for smaller modules, the high-frequency modules are usually designed such that the electrical components 918 are provided in close proximity. Accordingly, the cap 920 and the electrical components 918 are often designed in close proximity as well.

Meanwhile, a high-temperature solder (e.g., a melting point of 220° C. or above) has been used conventionally for the soldering in the high-frequency module. The user, on the other hand, used an eutectic solder having a melting point of 183° C., should the user having purchased the high-frequency module carried out the reflow process by himself/herself. That is to say, despite the reflow process by the user, the solder in the high-frequency module did not melt again (though it becomes slightly soft). Thus, no movement of the electrical components 918 or the cap 920 was incurred in the reflow process.

However, to be more environment friendly and for other reasons, it has become common in recent years among users to use a Pb-free solder to carry out the reflow process. Pb-free solders generally have a high melting point, and when the Pb-free solder used has a melting point of, for example, 220° C., it becomes essentially the same as the melting point of the high-temperature solder used in the soldering in the high-frequency module. Thus, if the user of the high-frequency module carries out the reflow using the Pb-free solder, the solder connecting the electrical components 918 and the cap 920 melts again, and movement of the electrical components 918 and the cap 920 occurs. This causes "solder touch" between the electrical components 918 and/or between the electrical components 918 and the cap 920. Therefore, there is demand in recent years for stabilizing the product quality of the high-frequency module by solving this problem.

SUMMARY OF THE INVENTION

The present invention was made in view of the foregoing problem, and it is an object of the present invention to provide high-frequency modules which can reduce the number of application points of an insulating adhesive and can suppress contact between components due to self-alignment which occurs in a reflow process, by applying the insulating adhesive between electrical components on a substrate.

In order to achieve this object, in a high-frequency module according to the present invention, a conductive cap provided for an electromagnetic shielding purpose is placed on a substrate on which a plurality of electrical components are mounted by soldering, and an insulating adhesive is applied between the plurality of electrical components.

With this arrangement, since the insulating adhesive is applied between the electrical components on the substrate, the insulating adhesive prevents such deficiencies as the "solder touch" between components due to self-alignment which is caused when the solder melts at the soldered portion in the reflow process. Thus, a highly reliable high-frequency module can be provided even when a Pb-free solder is used, and the number of application points of the insulating adhesive can be reduced.

For a fuller understanding of the nature and advantages of the invention, reference should be made to the ensuing detailed description taken in conjunction with the accompanying drawings.

BRIEF DESCRIPTION OF THE DRAWINGS

FIG. 2(a) and FIG. 2(b) are plan views showing a substrate used for the high-frequency module in accordance with one embodiment of the present invention.

FIG. 3(a) through FIG. 3(c) are explanatory drawings showing a configuration of a conductive cap.

FIG. 4 is a flow chart showing a manufacturing process of the high-frequency module in accordance with one embodiment of the present invention.

FIG. 7(a) and FIG. 7(b) are explanatory drawing showing how side walls of the cap and the adhesive are related to each other.

FIG. 8(a) and FIG. 8(b) are explanatory drawings showing how side walls of the cap and the adhesive are related to each other.

FIG. 10(a) and FIG. 10(b) are explanatory drawings showing the self-alignment effect of the cap.

FIG. 11(a) and FIG. 11(b) are explanatory drawings showing the self-alignment effect of the cap.

FIG. 14 is an explanatory drawing showing a reflow temperature profile.

FIG. 18(a) through FIG. 18(g) are perspective views showing steps of a conventional manufacturing process.

FIG. 19 is flow chart showing steps of a conventional manufacturing process of a high-frequency module.

DESCRIPTION OF THE EMBODIMENTS

Figure 1:
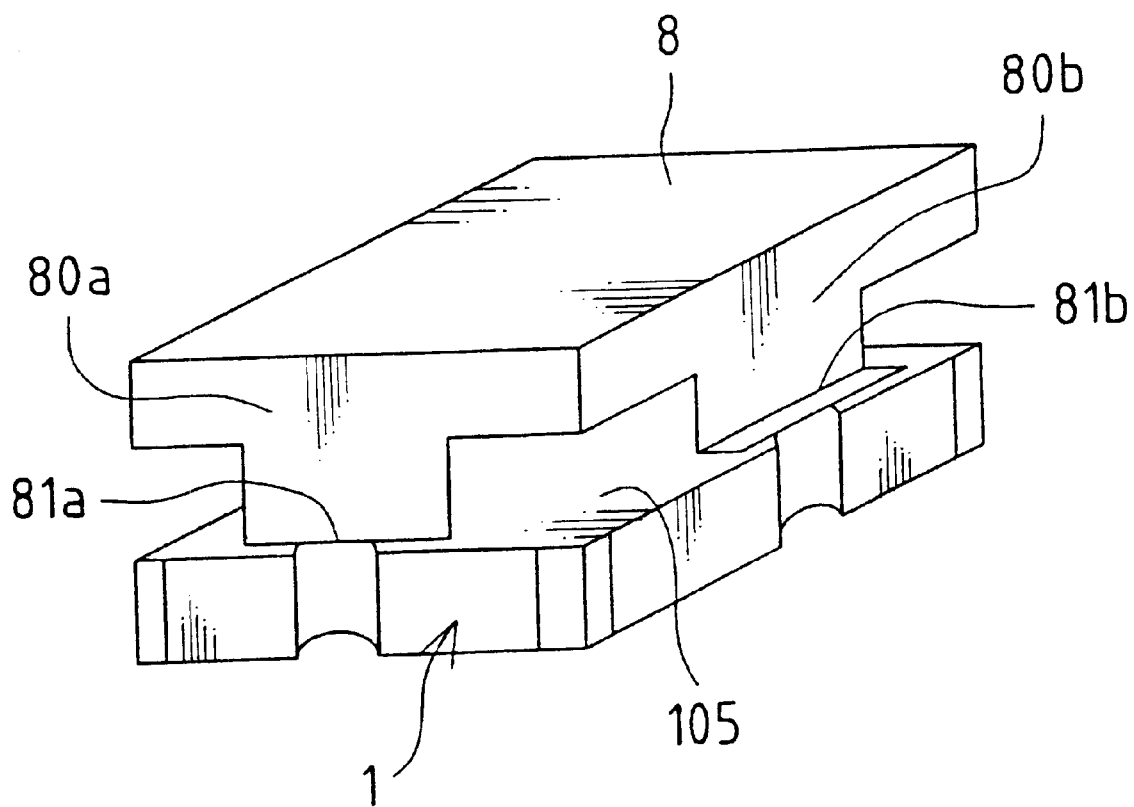
FIG. 1 is an external perspective view showing a packaged product high-frequency module in accordance with one embodiment of the present invention.

The following will describe high-frequency modules according to one embodiment of the present invention with reference to FIG. 1 through FIGS. 17(a) and 17(b).

FIG. 2(a) shows a state before electrical components 7a through 7e are mounted on a substrate 1, which is a portion of a series substrate 101, and FIG. 2(b) shows a state after the electrical components 7a through 7e are mounted on the substrate 1.

On a component bearing surface 105 of the substrate 1 are solder-printed electrodes 7aa, 7ab, . . . , 7ca, 7cb for the electrical components 7a through 7c, and electrodes for the electrical components 7d and 7e. Further, ground electrodes 2a and 2b for a conductive cap are also solder-printed. Further, an insulating adhesive agent (simply "adhesive" hereinafter) 6a through 6g, which is an insulating adhesive, is applied after the electrodes are solder-printed. Following this, the electrical components 7a through 7e are mounted. Note that, the solder used in the solder-print in the present embodiment is a Pb-free solder but not limited to this.

As shown in FIG. 3(a) through FIG. 3(c), a conductive cap 8 has side walls 80a and 80b making up the four sides of the substrate 1, and a ceiling 89, with an opened bottom. The cap 8 is soldered via lower end portions 81a and 81b of the side walls 80a and 80b to the ground electrodes 2a and 2b which are formed on the component bearing surface 105 as shown in FIG. 2(a).

More specifically, the substrate 1 is placed in a reflow vessel in the state of the series substrate 101 after being provided with the electrical components 7a through 7e and the cap 8, before it becomes a packaged product as shown in FIG. 1.

That is, the cap 8 is soldered via the lower end portions 81a and 81b to the ground electrodes 2a and 2b which are formed on the component bearing surface 105. Thus, the cap 8 can be soldered to the substrate 1 in the state of the series substrate 101. Further, the application of the adhesives 6a through 6g prevents "solder touch" between the electrical components 7a through 7e which may be caused due to self-alignment by the melted solder in the reflow process, even when the electrical components 7a through 7e are provided in close proximity. Further, even when the packaged product as shown in FIG. 1 is subjected to the reflow process by a user, it is possible to prevent "solder touch" between the electrical components 7a through 7e and/or between the electrical components 7a through 7e and the cap 8 which may be caused by the solder that was melted again.

That is, in the high-frequency modules of the present embodiment, as shown in FIG. 4, the following processes can be carried out while the substrates 1 are in the state of the series substrate 101: solder printing (S1), application of the adhesives 6a through 6g (S2), mounting of the electrical components 7a through 7e (S3), mounting of the cap 8 (S4), reflow process (S5), and trimming (S6). As a result, the manufacturing process becomes much more efficient, and manufacturing cost can be reduced by a large margin.

Figure 5:
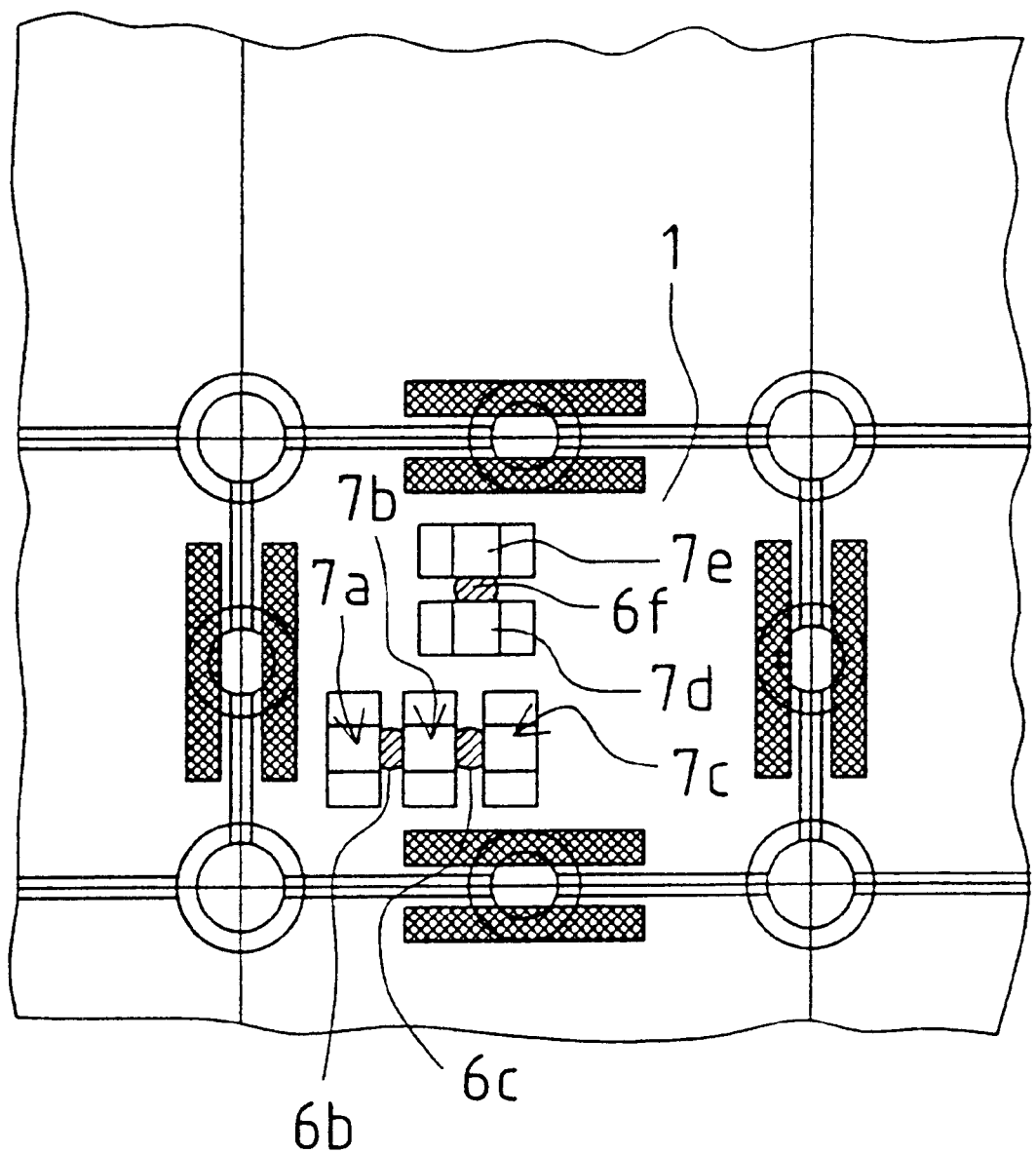
FIG. 5 is an explanatory drawing showing how electrical components and an adhesive are related to each other.

FIG. 5 shows a high-frequency module with a structure wherein the adhesive is applied between the electrical components. That is, adhesives 6b, 6c, and 6f are applied only between the electrical components 7a and 7b, 7b and 7c, and 7d and 7e, respectively.

In the high-frequency module of this structure, the adhesives prevent "solder touch" between the electrical components 7a through 7e which may be caused by self-alignment during the reflow process. This prevents defects and therefore improves product yield, in addition to reducing the number of application points of the adhesive.

That is, in the conventional high-frequency module structure in which no adhesive is applied, due to the close proximity of the components (0.1 mm to 0.2 mm) necessitated by the small size of the high-frequency module, "solder touch" is caused between the electrical components 7a through 7e by the self-alignment which occurs during the reflow process. The products with "solder touch" are difficult to repair, and this poses the problem of lower yield among other deficiencies. Such deficiencies can be solved by the high-frequency modules of the present embodiment.

Figure 6:
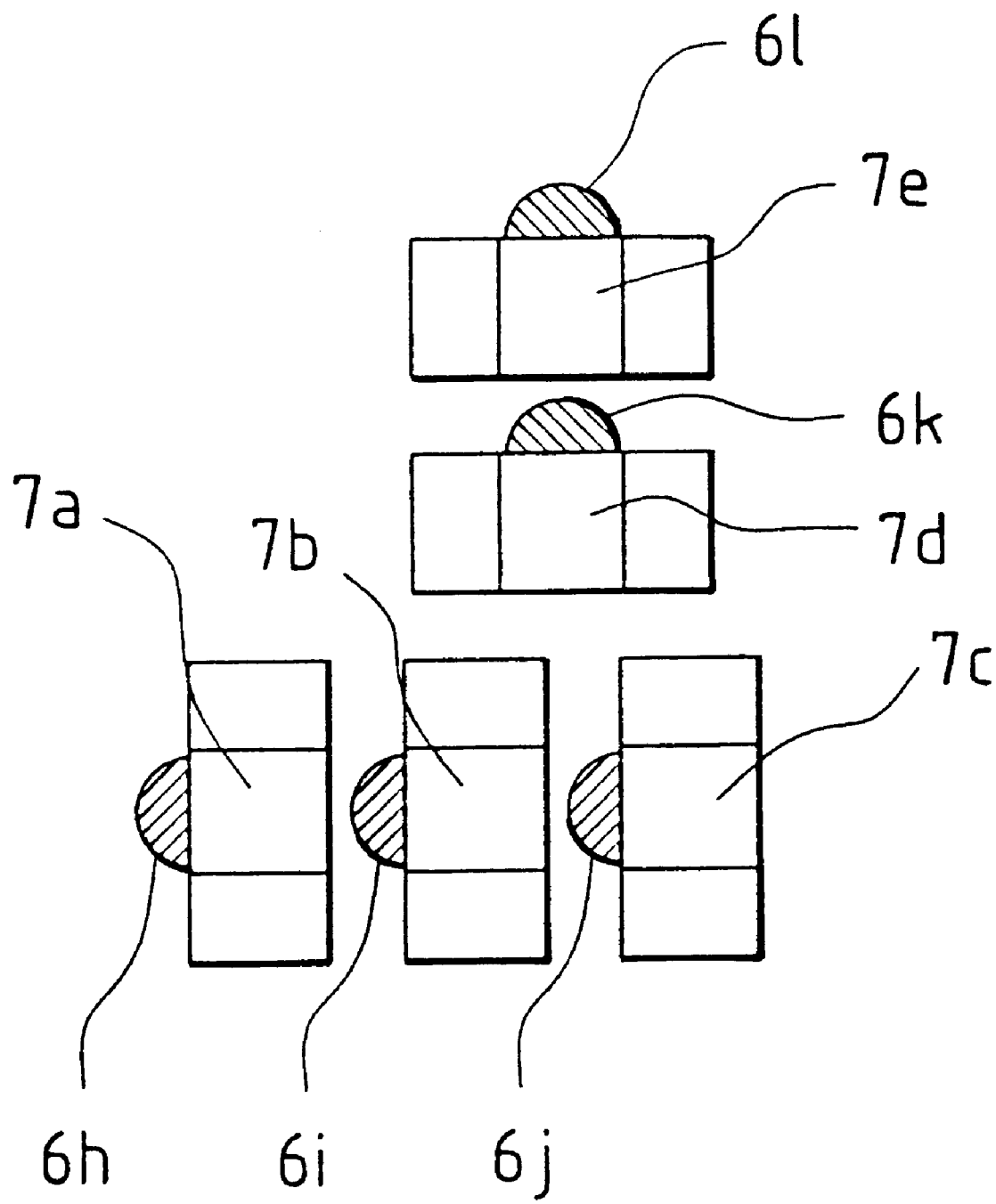
FIG. 6 is an explanatory drawing showing how electrical components and an adhesive are related to each other.

FIG. 6 shows a high-frequency module with a structure wherein the application points of the adhesives correspond to the positions where the electrical components are attached. That is, adhesives 6h through 6l are applied to cover the area between the electrical components 7a through 7e and the component bearing surface and between the electrical components 7a through 7e adjacent to one another.

In the high-frequency module of this structure, as with that of FIG. 5, the adhesives prevent the "solder touch" between the components which is caused by self-alignment in the reflow process. This suppresses defective products and improves product yield. Further, since the electrical components 7a through 7e and the adhesives 6h through 6l correspond to each other one to one, the adhesives 6h through 6l can be provided sufficiently for the electrical components 7a through 7e, and the mechanical strength of fastening the electrical components 7a through 7e can be improved.

Further, FIG. 7(a) and FIG. 7(b) show a high-frequency module of a structure in which ground electrodes 2aa and 2ba are longer in length than the lower end portions 81a and 81b of the side walls 80a and 80b in directions along the lower end portions 81a and 81b, and adhesives 9aa and 9ba are applied to the respective ends of the ground electrodes 2aa and 2ba.

That is, length L2aa of the ground electrode 2aa corresponding to the side wall 80a is longer than length L81a of the lower end portion 81a of the side wall 80a. Also, length L2ba of the ground electrode 2ba corresponding to the side wall 80b is longer than length L81b of the lower end portion 81b of the side wall 80b. Further, the adhesives 9aa and 9ba are applied to the respective ends of the ground electrodes 2aa and 2ba.

In the high-frequency module of this structure, as with that of FIG. 5, the adhesives prevent "solder touch" between the components which is caused by self-alignment during the reflow process. This suppresses defective products and improves product yield. Further, since the electrical components 7a through 7e and the adhesives 6h through 6i correspond to each other one to one, the adhesives 6h through 6i can be provided sufficiently for the electrical components 7a through 7e, and the mechanical strength of fastening the electrical components 7a through 7e can be improved.

Further, FIG. 8(a) and FIG. 8(b) show a high-frequency module of a structure in which ground electrodes 2ab and 2bb are shorter in length than the lower end portions 81a and 81b of the side walls 80a and 80b in directions along the lower end portions 81a and 81b, and adhesives 9ab and 9bb are applied to the respective ends of the ground electrodes 2a and 2b.

That is, length L2ab of the ground electrode 2ab corresponding to the side wall 80a is shorter than length L81a of the lower end portion 81a of the side wall 80a. Also, length L2bb of the ground electrode 2bb corresponding to the side wall 80b is shorter than length L81b of the lower end portion 81b of the side wall 80b. Further, the adhesives 9ab and 9bb are applied to areas of extensions of the ground electrodes 2ab and 2bb in their lengthwise directions and in the vicinity of the respective ends of the ground electrodes 2ab and 2bb.

In the high-frequency module of this structure, the adhesives 9ab and 9bb are formed outside of the area where the ground electrodes 2ab and 2bb are formed, i.e., the adhesives 9ab and 9bb are formed where there are no ground electrodes 2ab and 2bb. Thus, even when cream solders 10a and 10b melt, they do not mix with the adhesives 9ab and 9bb. This prevents lowering of strength of solder connection between the ground electrodes 2ab and 2bb and the lower end portions 81a and 81b of the side walls 80a and 80b in the reflow process, thus realizing stable solder connection.

Figure 9A:
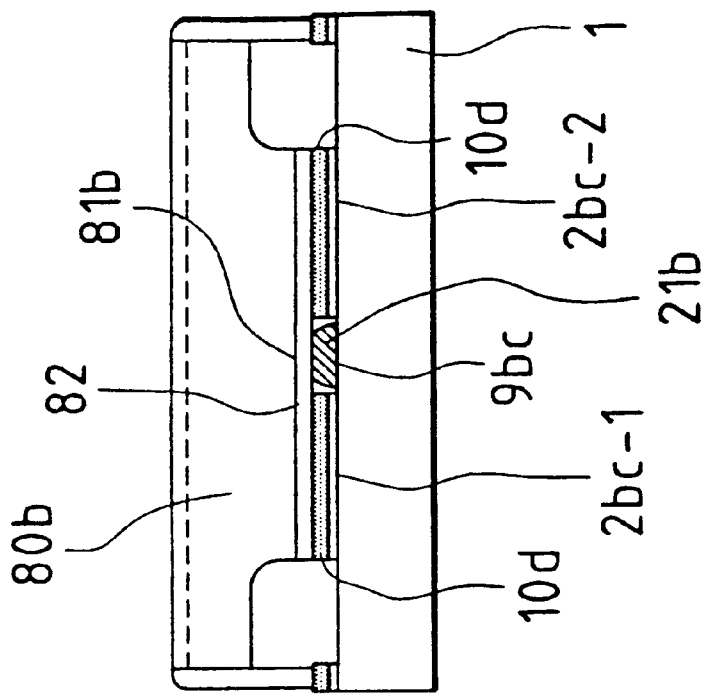
FIG. 9(a) and FIG. 9(b) are explanatory drawings showing how side walls of the cap and the adhesive are related to each other.
Figure 9B:
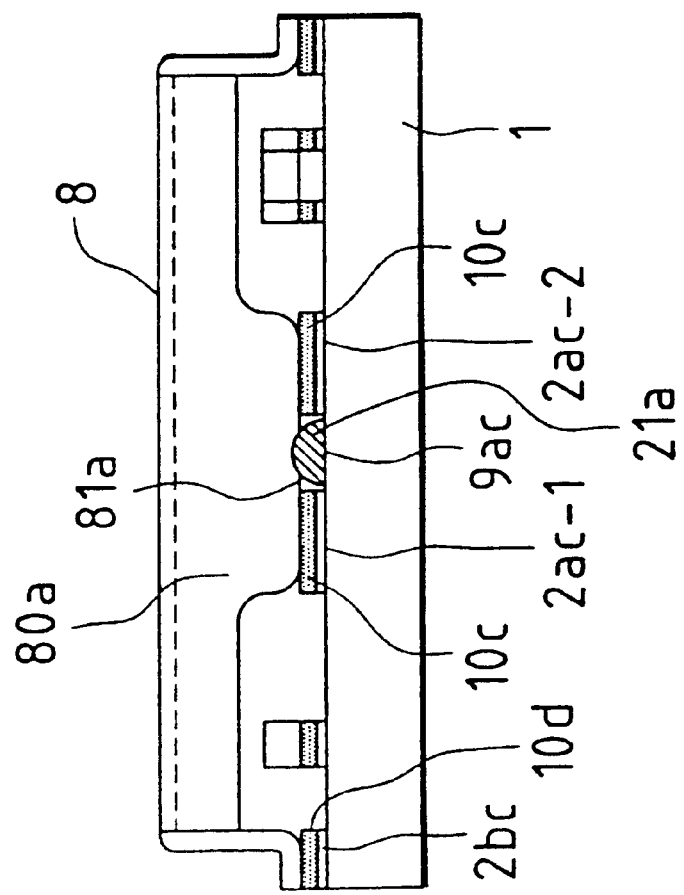

In a high-frequency module as shown in FIG. 9, the ground electrodes are divided into two parts with non-electrode portions 21a and 21b therebetween in directions along the lower end portions 81a and 81b of the side walls 80a and 80b of the cap 8, and adhesives 9ac and 9bc are applied to the non-electrode portions 21a and 21b.

That is, the ground electrode corresponding to the side wall 80a is divided into two electrodes 2ac-1 and 2ac-2, and the non-electrode portion 21a, where there is no electrode, is provided therebetween. Also, the ground electrode corresponding to the side wall 80b is divided into two electrodes 2bc-1 and 2bc-2, and the non-electrode portion 21b, where there is no electrode, is provided therebetween. Further, the adhesives 9ac and 9bc are applied only to the non-electrode portions 21a and 21b.

Note that, the non-electrode portions 21a and 21b may be formed, for example, a method such as etching by which a metal film of an area of the non-electrode portions 21a and 21b is removed.

In the high-frequency module of this structure, the adhesives 9ab and 9bb are provided where there are no electrodes, and therefore cream solders 10c and 10d do not mix with the adhesives 9ac and 9bc. Further, the adhesives 9ac and 9bc, which become soft by the heat of the reflow process, are prevented from bleeding into the surrounding area. This prevents lowering of strength of solder connection between the ground electrodes 2ac-1, 2ac-2, 2bc-1, and 2bc-2 and the lower end portions 81a and 81b of the side walls 80a and 80b in the reflow process, thus realizing stable solder connection.

In a high-frequency module as shown in FIG. 10(a) and FIG. 10(b), the respective lower end portions 81b of the pair of opposing side walls 80b has flat portions 82 which are parallel to the component bearing surface 105, and shapes of the flat portions 82 are symmetrical to each other.

That is, the respective lower end portions 81b of the pair of side walls 80b have the flat portions 82, parallel to the component bearing surface 105, which are formed by bending the respective lower edges of the side walls 80b. The direction of bending to form the flat portions 82 is away from the center of the cap 8, and the widths of the flat portions 82 are equal to each other.

In the high-frequency module of this structure, as shown in the upper case of FIG. 10(a) and FIG. 10(b), even when there is misalignment of the cap 8 when it is mounted, the misalignment of the cap 8 is corrected after the reflow process, as shown in the lower case of FIG. 10(a) and FIG. 10(b). This is due to the correcting force (self-alignment) which is generated by interaction of forces between the surface tension, which arises when cream solders 31a and 31b melt, and the dead weight.

Note that, in the foregoing structure in which the lower end portions 81b of the side walls 80b have the flat portions 82, a surface area parallel to the component bearing surface 105 is provided for the lower end portions 81b of the side walls 80b. This maximizes the surface tension of the solder which causes the self-alignment. As a result, "solder touch" can be prevented even when the electrical components 7a through 7e and the cap 8 are provided in close proximity (0.1 mm to 0.2 mm), and stable solder connection and improved yield in the manufacturing process can be realized.

In a high-frequency module as shown in FIG. 11(a) and FIG. 11(b), bottom surfaces 83a and 83b of the side walls 80a and 80b of a cap 8d are soldered to the ground electrodes 2ad and 2bd, and in a plan view, the cap 8 is smaller in size than the substrate 1, and widths 1a and 1b of the ground electrodes 2ad and 2bd are wider than substantially two times the thickness t of the side walls 80a and 80b, respectively.

That is, instead of bending the lower end portions 81a and 81b, the side walls 80a and 80b are directly soldered to the ground electrodes 2ad and 2bd at the bottom surfaces 83a and 83b. Further, the respective widths 1a and 1b of the ground electrodes 2ad and 2bd are wider than substantially two times the thickness t of the metal plate making up the cap 8d.

In the high-frequency module of this structure, as with that of FIG. 10(a) and FIG. 10(b), as shown in the upper case of FIG. 11(a) and FIG. 11(b), even when there is misalignment of the cap 8d when it is mounted, the misalignment of the cap 8d is corrected after the reflow process, as shown in the lower case of FIG. 11(a) and FIG. 11(b). This is due to the correcting force (self-alignment) which is generated by interaction of forces between the surface tension, which arises when the cream solders melt, and the dead weight.

Note that, in the foregoing structure in which the respective widths 1a and 1b of the ground electrodes 2ad and 2bd are wider than substantially two times the thickness t of the metal plate making up the cap 8d, because the respective widths 1a and 1b of the ground electrodes 2ad and 2bd are wider than substantially two times the thickness t, the surface tension of the solder which causes the self-alignment can be maximized. As a result, "solder touch" can be prevented even when the electrical components 7a through 7e and the cap 8 are provided in close proximity (0.1 mm to 0.2 mm), and stable solder connection and improved yield in the manufacturing process can be realized.

Figure 12:
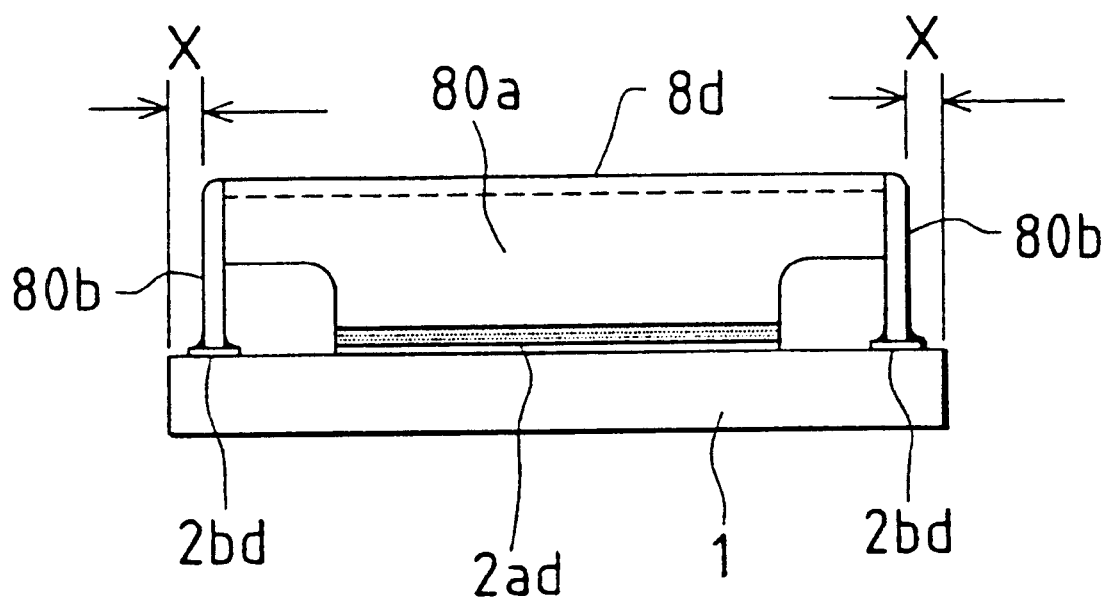
FIG. 12 is an explanatory drawing showing a positional relationship between planes cut by dicing and side walls of the cap.
Figure 13A:
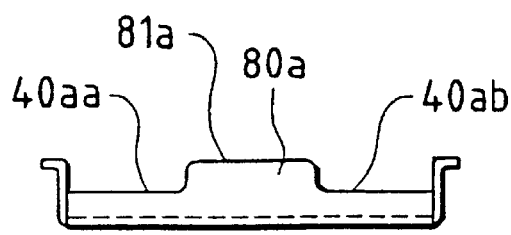
FIG. 13(a) through FIG. 13(d) are explanatory drawings showing a detailed configuration of the cap.
Figure 13B:
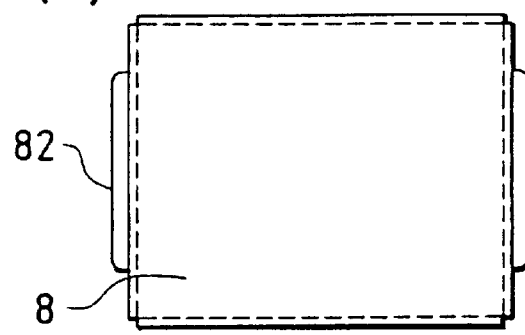
Figure 13D:
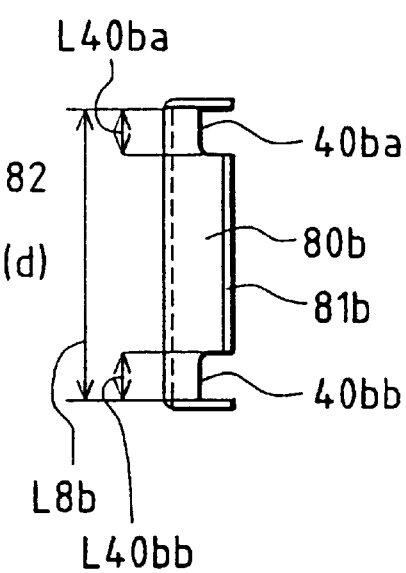
Figure 13C:
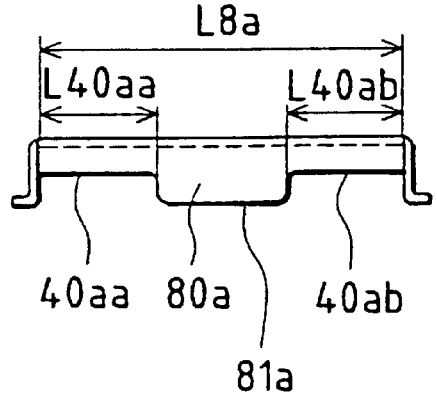

Further, when dividing the substrates 1 in the form of the series substrate 101 into individual substrates 1 by dicing, as shown in FIG. 12, gap x is provided between the path of a dicing instrument and the side walls 80a and 80b. Thus, even when there is variance in dicing, the side walls 80a and 80b of the cap 8d will not be damaged, thus stabilizing manufacturing process and improving yield.

Further, as described with reference to FIGS. 7(a) and 7(b) through FIG. 12, the cap 8 is connected to the ground electrodes 2a and 2b at least on four locations. That is, the cap 8 is connected to the ground electrodes 2a and 2b via the respective lower end portions 81a and 81b of the four side walls 80a and 80b. This stabilizes high frequency characteristics even in a high-frequency module with the frequency of 800 MHz and greater, thus providing stable products.

Further, because the flat portions 82 are provided only for the lower end portions 81b of the side walls 80b of the cap 8 but not for the lower end portions 81a of the side walls 80a, the size of products can be reduced without losing stability of the high frequency characteristics (in the structure where the flat portions are provided also for the lower end portions 81a, the area of these flat portions adds to the total area). Note that, the flat portions may alternatively be provided only for the lower end portions 81a but not for the lower end portions 81b.

FIG. 13(a) through FIG. 13(d) show a high-frequency module having cut-out portions 40aa through 40bb at end portions of the side walls 80a and 80b in directions along the lower end portions 81a and 81b of the side walls 80a and 80b.

That is, there are provided cut-out portions 40aa and 40ab, which are narrow in shape in the direction of the lower end portions 81a, at the both ends in the lengthwise direction of the side walls 80a. Further, the cut-out portions 40aa and 40ab are formed in such a manner that their lengths L40aa and L40ab are related to length L8a of the side walls 80a along the lower end portions 81a by the following equation $$L40aa + L40ab \geq (\frac{1}{2})L8a.$$

Further, similarly, there are provided cut-out portions 40ba and 40bb, which are narrow in shape in the direction of the lower end portions 81b, at the both ends in the lengthwise direction of the side walls 80b. Further, the cut-out portions 40ba and 40bb are formed in such a manner that their lengths L40ba and L40bb are related to length L8b of the side walls 80b in a direction along the lower end portions 81b by the following equation $$L40ba + L40bb \leq (\frac{1}{2})L8b.$$

In the high-frequency module of this structure, even when the substrates 1 in the form of the series substrate 101 bearing the electrical components 7a through 7e and the cap 8 are placed in a reflow vessel, there will be an air flow through the cut-out portions 40aa, 40ab, 40ba, and 40bb, and this allows heated air to be guided into the cap 8 with a good balance. As a result, it is possible to stably supply heat to the solder used to connect the electrical components 7a through 7e and the cap 8 with each other.

Further, because of the described shape of the cut-out portions 40aa, 40ab, 40ba, and 40bb, inside the high-frequency module can be electromagnetically shielded by the cap 8. Thus, predetermined high frequency characteristics are ensured and high frequency characteristics can be stabilized.

The following describes the adhesive used in the foregoing high-frequency modules with reference to FIG. 14.

The heat-curable characteristics of the adhesive used in the present embodiment are such that, as shown in FIG. 14, the adhesive is not cured in a pre-heat zone 51 of the reflow vessel and is cured in a reflow zone 52 of the reflow vessel.

That is, the adhesives used in the foregoing high-frequency modules, for example, the adhesive for bonding the lower surfaces of the electrical components 7a through 7e, and the lower edges of the side walls 80a and 80b of the cap 8 have such heat-curable characteristics that they are not cured in a temperature range in the vicinity of 150° C., which is the pre-heat zone 51 of the reflow vessel, and are cured in a temperature range of not less than 210° C., which is the reflow zone 52 of the reflow vessel. The adhesive may be, for example, the self-alignment adhesive JU-R1 provided by Koki Company Limited (ingredient: epoxy-based resin, viscosity (Ps): 600, structural viscosity: 4.5, surface insulating resistance ($\Omega$): $1 \times 10^{13}$ or higher, curing condition: 210° C. to 230° C.). FIG. 14 mainly shows a reflow-temperature profile of the JU-R1. That is, since the adhesive is not cured in a temperature range in the vicinity of 150° C. which is the pre-heat zone, the self-alignment effect, which is exhibited when the solder is melted, will not be lost, and the adhesive is cured in a temperature range of not less than 210° C. which is the reflow zone.

Thus, the electrical components 7a through 7e and the cap 8 can be fixed on the substrate 1 without losing the self-alignment effect which is exhibited when the solder is melted in the reflow zone. Further, in the case where the user carries out the reflow process of the present embodiment, the "solder touch" between the electrical components and/or between the electrical components and the cap can be prevented because the electrical components 7a through 7e and the cap 8 have been fixed by the cured adhesive by the time the reflow process is carried out. Namely, it is possible to provide a high-frequency module of a stable quality and ensured mechanical strength.

Figure 15:
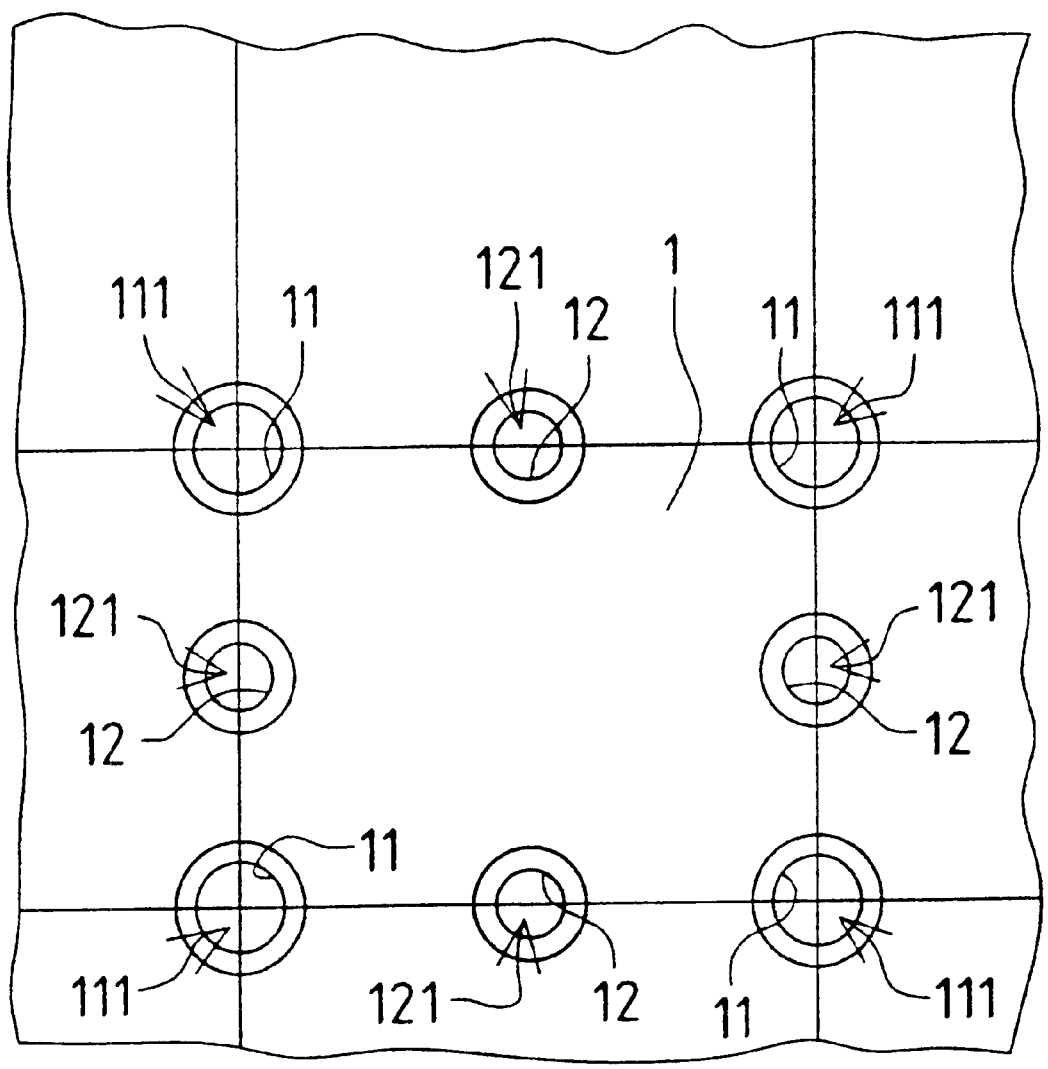
FIG. 15 is an explanatory drawing showing a configuration of depressions formed on the substrate.

FIG. 15 shows a high-frequency module having a corner depression 11 of an arc shape for each corner of the substrate 1, and a side depression 12 of an arc shape for each side of the substrate 1. In a plan view, the corner depression 11 is in the form of a sector with the central angle in the vicinity of 90°, and the side depression 12 is in the form of a near semi-circle. Further, the radius of the arc of the corner depression 11 is larger than that of the side depression 12.

That is, the corner depression 11 is a part of a circumference of an opening 111 around a center where corners of four substrates 1 meet when the substrates 1 are in the form of the series substrate 101 before it is divided into individual pieces. Further, the side depression 12 is a part of a circumference of an opening 121 around a center which is on a common side of two substrates 1 when the substrates 1 are in the form of the series substrate 101. Further, the radius of the opening 111 is made larger than that of the opening 121.

This stabilizes a heat quantity balance and suppresses uneven heat transfer in the reflow process of the series substrate 101. As a result, it is possible to suppress tomb stones and misalignment, and "solder touch" between the electrical components 7a through 7e, thus improving product quality and yield of the high-frequency module.

Figure 16:
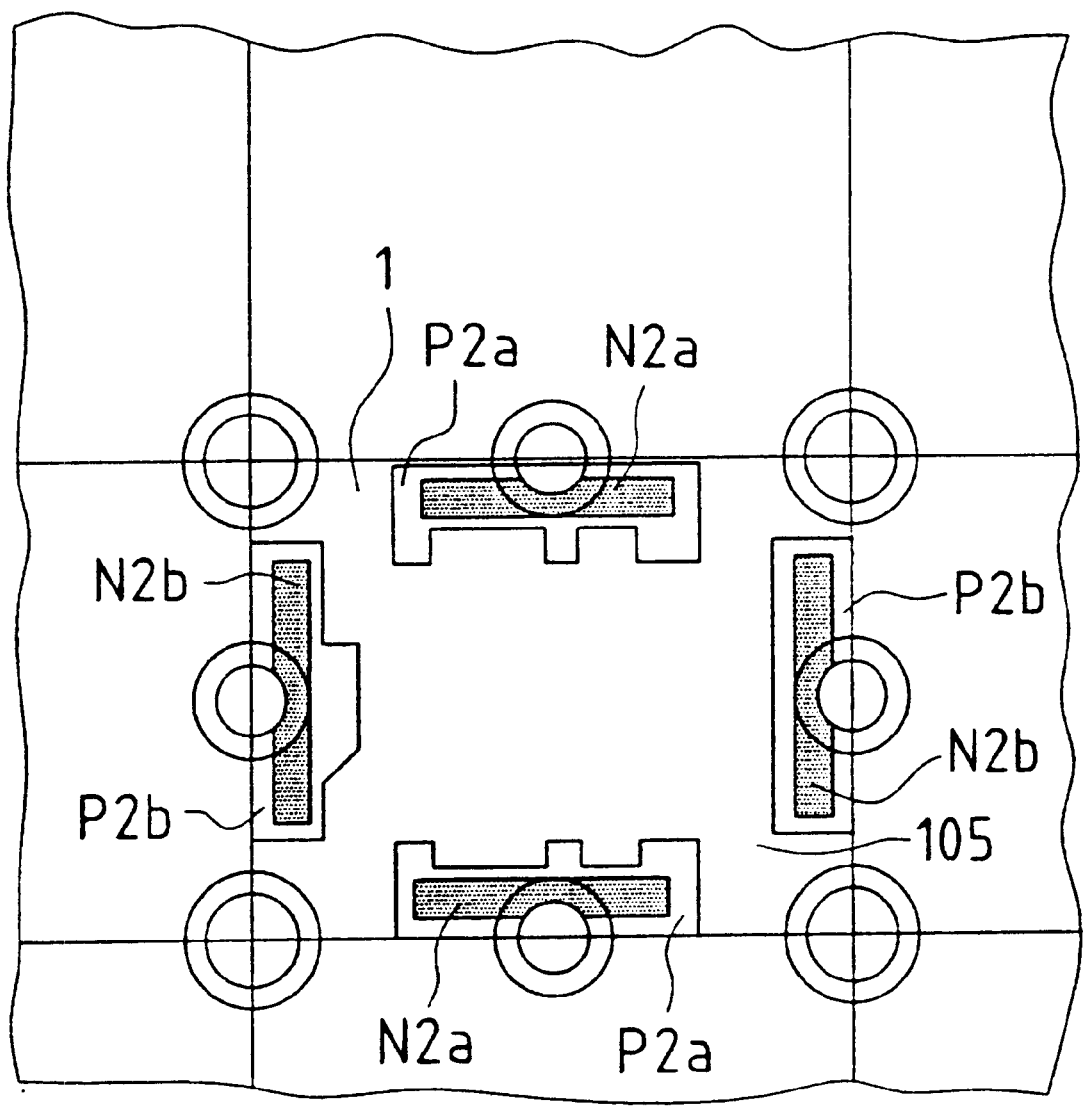
FIG. 16 is an explanatory drawing showing a configuration of a resist formed on the substrate.
Figure 17:
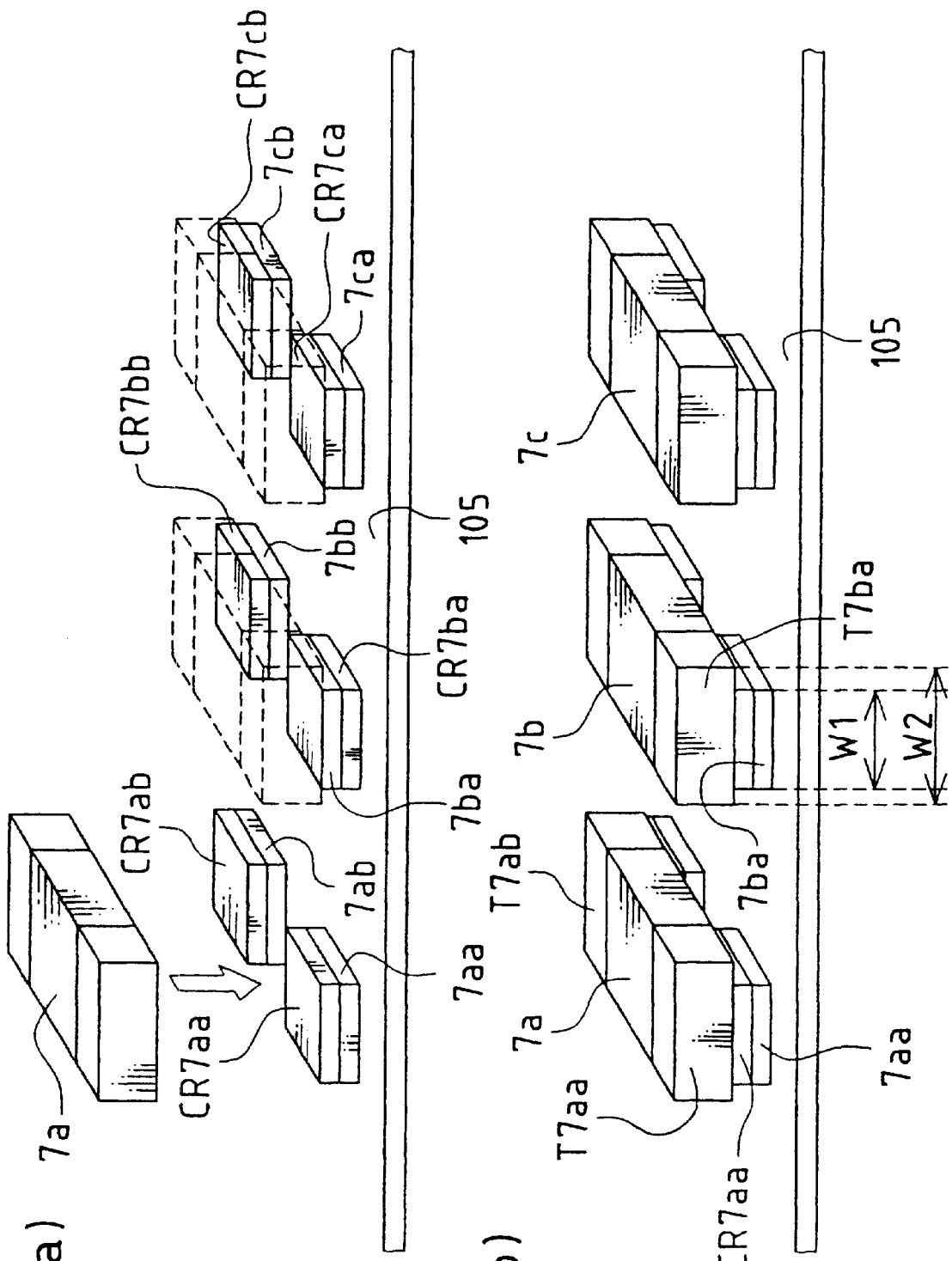
FIG. 17(a) and FIG. 17(b) are explanatory drawings showing how an electrode configuration of the electrical components are related to a configuration of connecting lands.

FIG. 16 shows a high-frequency module in which a resist is formed on the component bearing surface 105 of the substrate 1 of FIG. 15, and the cap 8 is soldered, via non-resist portions N2a and N2b, on pattern lands P2a and P2b which become the ground electrodes. Further, the shapes of the pair of non-resist portions N2a (N2b) are symmetrical to each other in the pair of pattern lands P2a (P2b), which become the ground electrodes corresponding to the opposing side walls 80a (80b).

That is, the shapes of the non-resist portions N2a of the pattern lands P2a, which become the ground electrodes corresponding to the opposing side walls 80a are symmetrical to each other. Further, the shapes of the non-resist portions N2b of the pattern lands P2b are also symmetrical to each other, even though the pair of pattern lands P2b, which become the ground electrodes corresponding to the side walls 80b, are asymmetrical to each other. Note that, the resist is removed, for example, by etching.

Thus, the non-resist portions N2a and N2b can have shapes which correspond to the lower end portions 81a and 81b of the cap 8, respectively, regardless of the shapes of the pattern lands P2a and P2b, which become the ground electrodes 2a and 2b. Further, because the opposing non-resist portions N2a (N2b) are symmetrical to each other, the effect of self-alignment in the reflow process can be maximized. This suppresses the "solder touch" between the inner walls of the cap 8 and the electrical components 7a through 7e, and misalignment of the cap 8, thus stabilizing product quality and improving product yield.

FIG. 17(a) and FIG. 17(b) show a high-frequency module before and after it is provided with the electrical components, wherein, electrode connecting lands 7aa, 7ab, . . . , 7ca, 7cb, which are provided on the component bearing surface 105 and connected to connecting surfaces of electrodes T7aa, T7ab, . . . , T7ca, T7cb of the electrical components 7a through 7c opposite the component bearing surface 105, are made smaller in size than their corresponding connecting surfaces.

Taking the electrode T7ba of the electrical component 7b as an example, the electrode connecting land 7ba is made so that its width W1 is narrower than width W2 of the electrode T7ba. Note that, the other electrodes T7aa, T7ab, etc., also have the same relation to their corresponding electrode connecting lands 7aa, 7ab, . . . , 7ca, 7cb.

Further, when mounting the electrical components 7a through 7c, cream solders CR7aa, CR7ab, . . . , CR7ca, CR7cb corresponding to the electrode connecting lands 7aa, 7ab, . . . , 7ca, 7cb spread (bleed) by the load of pressure. However, because the width W1 and the width W2 are related to each other by the foregoing ratio, the electrical components 7a through 7c will not be joined together via the cream solders CR7aa, CR7ab, . . . , CR7ca, CR7cb even when the cream solders CR7aa, CR7ab, . . . , CR7ca, CR7cb spread.

This restricts movement of the self-alignment which occurs when the solder is melted in the reflow process, and suppresses such deficiencies as "solder touch" between the electrical components, and misalignment and tomb stones even when the electrical components are mounted in close proximity with a distance of 0.1 mm to 0.2 mm. As a result, product quality can be stabilized and product yield can be improved.

The following describes a manufacturing method of the high-frequency modules of the present embodiment with reference to FIG. 4.

A manufacturing method of the high-frequency modules of the present embodiment includes the steps of: carrying out a reflow process with respect to the series substrate 101 which has been divided into areas of a plurality of substrates 1 and provided with the electrical components 7a through 7e and the cap 8 for each area of the plurality of substrates 1 (S5); trimming the series substrate 101 after the reflow process (S5) with respect to each area of the plurality of substrates 1 (S6); and dividing the series substrate 101 after the trimming (S6) into the substrates 1 (S7).

Thus, the only step carried out with respect to individual pieces of the substrates 1 is the step of performance inspection (S8), and the preceding steps (S1 through S7) are carried out with respect to the series substrate 101. Therefore, in an arrangement where a single series substrate 101 is divided into, for example, 300 pieces of substrates 1, the step of mounting the cap 8 (S4), and the step of trimming (S6) can be greatly simplified. Further, soldering of the cap 8 is finished in the reflow process (S5) which is carried out with respect to the series substrate 101. Thus, much less time is required for handling operation and processing cost can be reduced, thereby reducing cost of the high-frequency module.

Further, as described above with reference to FIGS. 7(a) and 7(b) through FIG. 12, in the reflow process (S5), reflow of the series substrate 101 is carried out while the cap 8 is mounted on the substrate 1 via the solder.

Since reflow of the series substrate 101 is carried out while the cap 8 is mounted via the cream solder (10a through 10d), the surface tension which is brought about by the melted solder in the reflow process can be maximized, and this improves the effect of self-alignment. As a result, it is possible to stabilize solder connection, and improve quality of the manufacturing process and product yield, even when the electrical components 7a through 7e and/or the cap 8 are mounted in close proximity with a distance of 0.1 mm to 0.2 mm.

In addition to the foregoing object, another object of the present invention is to provide a high-frequency module which can suppress contact between components which is caused by self-alignment in the reflow process, and which can improve mechanical strength of fastening the electrical components, the object being attained by using the insulating adhesive which is applied over the substrate between the electrical components also for the purpose of fixing the electrical components.

Further, another object of the present invention is to provide a high-frequency module which allows fastening of caps and trimming to be performed while the substrate is in an undivided form before it is divided into individual pieces, the object being attained by the structure wherein the caps are soldered on the ground electrodes which are formed on the component bearing surface. Yet another object is to provide a high-frequency module which can suppress the "solder touch" between the electrical components and the cap which is caused by self-alignment in the reflow process, the object being attained by applying the insulating adhesive on the end portions of the lower edges of the side walls of the cap.

Further, in addition to the foregoing objects, another object is to provide a high-frequency module which can prevent connection failure of a solder between the ground electrodes and the side walls of the cap in the reflow process, the object being attained by preventing the insulating adhesive from mixing with the soldered portion.

Further, another object is to provide a high-frequency module which can prevent the "solder touch" even when the electrical components and the cap are provided in close proximity.

Further, another object is to provide a high-frequency module which can prevent damage to the side walls of the cap which is caused by inconsistent dicing.

Further, another object is to provide a high-frequency module which can stabilize high frequency characteristics.

Further, another object is to provide a high-frequency module which can prevent unbalanced heat quantity and uneven heat transfer in the reflow process.

Further, another object is to provide a high-frequency module which can fix the electrical components and the caps without losing the effect of self-alignment which is exhibited when the solder is melted in the reflow process in the reflow zone, and which can prevent the "solder touch" between the electrical components and/or between the electrical components and the cap in the reflow process performed by the user.

Further, another object is to provide a high-frequency module which can suppress such deficiencies as tomb stones, misalignment, and the "solder touch" between the electrical components.

Further, another object is to provide a high-frequency module which can prevent the "solder touch" between the inner walls of the cap and the electrical components, and which can suppress misalignment of the cap, the object being attained by improving the effect of self-alignment in the reflow process.

Further, another object is to provide a high-frequency module which can prevent misalignment of the electrical components, and which can suppress the "solder touch" between the electrical components, and tomb stones even when the electrical components are mounted in close proximity.

Further, yet another object of the present invention is to provide a manufacturing method of a high-frequency module which can reduce manufacturing cost by simplifying handling operation by way of increasing the number of steps which are carried out with respect to the series substrate.

Further, another object is to provide a manufacturing method of a high-frequency module which can improve the effect of self-alignment with respect to the cap by carrying out the reflow process while the cap is mounted on the substrate via a solder.

Further, another object is to provide a high-frequency module which is more environment friendly and a manufacturing method of such a high-frequency module, the object being attained by using a Pb-free solder for soldering the electrical components and the caps.

A high-frequency module of the present invention includes a substrate with a component bearing surface on which the electrical components are mounted by a solder, and a conductive cap for magnetoelectrically shielding the substrate and the electrical components from each other, wherein the insulating adhesive is applied over the substrate between the electrical components.

With this arrangement, since the insulating adhesive is applied between the electrical components on the substrate, the insulating adhesive prevents such deficiencies as the "solder touch" between the components due to self-alignment which is caused by the solder which melts in the reflow process. As a result, a highly reliable high-frequency module can be provided, and the number of application points of the insulating adhesive can be reduced.

Further, in addition to this arrangement, the insulating adhesive is also used for the purpose of fixing adjacent electrical components.

That is, the insulating adhesive prevents the "solder touch" between the components due to self-alignment which occurs in the reflow process. Further, since the adhesive is provided for each electrical component with a sufficient quantity, the mechanical strength of fastening the electrical components can be improved.

Further, a high-frequency module of the present invention includes a substrate, rectangular in shape, with a component bearing surface on which electrical components are mounted by soldering, and a conductive cap for electromagnetically shielding the substrate and the electrical components from each other, the cap being made up of side walls respectively corresponding to four sides of the substrate, and a ceiling and an opened bottom, wherein the cap is soldered at lower end portions of the side walls to ground electrodes which are formed on the component bearing surface, and the ground electrodes are longer in length than the lower end portions in a direction along the lower end portions of the side walls, and an insulating adhesive is applied to respective ends of the ground electrodes.

With this arrangement, it is not required to divide the substrate into individual pieces and expose side surfaces of the substrates to solder the cap with respect to the component bearing surface of the substrate. Further, trimming can be carried out once the cap is soldered to the substrate. Further, the gaps between the ends of the lower end portions of the side walls in their lengthwise directions and the ground electrodes are closed almost completely by the insulating adhesive. Thus, even when there is self-alignment in the reflow process, there will be no "solder touch" between the electrical components and the cap, and between the electrical components.

Further, in addition to this arrangement, the ground electrodes are shorter in length than the lower end portions in a direction along the lower end portions of the side walls of the cap, and an insulating adhesive is applied to respective ends of the ground electrodes.

According to this arrangement, since the insulating adhesive is provided in an area where there is no electrode, the solder does not mix with the insulating adhesive. This prevents lowering of strength of solder connection in the reflow process.

Further, in addition to the foregoing arrangement, the ground electrodes are each divided into two parts with a non-electrode portion therebetween in a direction along the lower end portions of the side walls of the cap, and the insulating adhesive is applied to the non-electrode portion.

According to this arrangement, since the insulating adhesive is provided in an area where there is no electrode, the solder does not mix with the insulating adhesive. Further, the insulating adhesive, which becomes soft by the heat of the reflow process, does not bleed into the surrounding area, thus preventing lowering of strength of the solder connection between the ground electrodes and the lower end portions of the side walls in the reflow process.

Further, in addition to the foregoing arrangement, the lower end portions of a pair of opposing side walls respectively have flat portions parallel to the component bearing surface, and shapes of the flat portions are symmetrical to each other.

With this arrangement, even when there is misalignment of the cap, it is corrected by the self-alignment effect by the surface tension of the solder which was melted in the reflow process.

Further, in addition to the foregoing arrangement, in an arrangement where the lower end portions of the side walls of the cap are soldered to the ground electrodes, when viewed from front, the cap is smaller in size than the substrate, and the width of each ground electrode is wider than two times the thickness of the side walls.

With this arrangement, even when there is misalignment of the cap when it is mounted on the substrate, the misalignment of the cap is corrected by the self-alignment effect in the reflow process. Further, since the width of the ground electrodes is two times the thickness, the surface tension of the solder which causes the self-alignment can be maximized. Further, a gap is provided between a path of a dicing instrument and the side walls.

Further, in addition to the foregoing arrangement, the cap is connected to the ground electrodes on at least four locations.

This provides a sufficient electromagnetic shielding effect by the cap even at the frequency of 800 MHz or greater.

Further, in addition to the foregoing arrangement, end portions of the side walls have cut-out portions.

With this arrangement, even when the substrates in the form of the series substrate with the caps are placed in a reflow vessel, there will be an air flow through the cut-out portions, and this allows heated air to be guided into the caps with a good balance. As a result, it is possible to prevent unbalanced heat quantity and uneven heat transfer in the reflow process.

Further, in addition to the foregoing arrangement, the adhesive has such heat curable characteristics that the adhesive is not cured in a pre-heat zone of a reflow vessel, and is cured in a reflow zone of the reflow vessel.

With this arrangement, the electrical components and the caps can be fixed on the substrate without losing the effect of self-alignment which is exhibited when the solder is melted in the reflow process in the reflow zone. Further, the electrical components and the cap are still fixed in the reflow process performed by the user. Thus, the "solder touch" between the electrical components and/or between the electrical components and the cap can also be provided even in the reflow process performed by the user.

Further, in addition to the foregoing arrangement, a corner depression of an arc shape is provided for each of four corners of the substrate, and a side depression of an arc shape is provided for each side of the substrate, and when viewed from front, the corner depression is in the form of a sector with a central angle in the vicinity of 90°, and the side depression is substantially a semi-circle, and a radius of the arc of the corner depression is larger than that of the side depression.

With this arrangement, the heat quantity balance is stabilized and uneven heat transfer is suppressed in the reflow process with respect to the series substrate. Thus, it is possible to prevent such deficiencies as tomb stones, misalignment, and the "solder touch" between the electrical components.

Further, in addition to the foregoing arrangement, in an arrangement where a resist is formed on the component bearing surface of the substrate and the cap is soldered via non-resist portions to pattern lands which become the ground electrodes, shapes of the non-resist portions are symmetrical to each other in a pair of pattern lands which become the ground electrodes corresponding to a pair of opposing side walls, respectively.

According to this arrangement, since the shapes of the non-resist portions are symmetrical to each other, the effect of self-alignment in the reflow process can be maximized. Thus, it is possible to prevent the "solder touch" between the inner walls of the cap and the electrical components, and suppress misalignment of the cap.

Further, in addition to the foregoing arrangement, with respect to a connecting surface of an electrode of the electrical components, which is a surface corresponding to the component bearing surface, an electrode connecting land which is formed on the component bearing surface and connected to the connecting surface is made smaller in size.

This restricts movement of the self-alignment which occurs when the solder is melted in the reflow process, and suppresses such deficiencies as the "solder touch" between the electrical components, and misalignment and tomb stones even when the electrical components are mounted in close proximity.

Further, a manufacturing method of a high-frequency module of the present invention is to manufacture the foregoing high-frequency modules, and includes the steps of: dividing a series substrate into a plurality of areas, and providing the electrical components and the cap with respect to each of the divided areas; subjecting the series substrate to a reflow process; carrying out trimming with respect to each of the divided areas; and dividing the series substrate into individual substrates.

According to this method, the reflow process is carried out with respect to the series substrate, and only a few steps, for example, the step of performance inspection is required for the individual substrates, which would otherwise require more of these steps which are tedious and time consuming. As a result, much less time and effort is required for handling operation than conventionally, and cost of the products can be reduced.

Further, a manufacturing method of a high-frequency module of the present invention includes the steps of: carrying out a reflow process with respect to a series substrate which has been divided into areas of a plurality of substrates and which has been provided with the electrical components and the cap with respect to each of the divided areas; carrying out trimming with respect to the series substrate after the reflow process with respect to each of the divided areas; and dividing the series substrate after the trimming into individual substrates.

With this method, only a few steps, for example, the step of performance inspection is required for the individual divided substrates. As a result, much less time and effort is required for handling operation, and cost of processing can be reduced.

Further, in addition to the foregoing arrangement, in the reflow step, reflow of the series substrate is carried out while the caps are mounted on the substrates via a solder.

With this arrangement, the surface tension which is exerted when the solder is melted can be maximized in the reflow process, thereby improving the self-alignment effect.

Further, in the high-frequency modules and the manufacturing methods of the high-frequency modules according to the present invention, a Pb-free solder is used for soldering the electrical components and the caps. Thus, it is possible to realize high-frequency modules and manufacturing methods of the high-frequency modules which are more environment friendly.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A high-frequency module in which a conductive cap provided for an electromagnetic shielding purpose is placed on a substrate on which a plurality of electrical components are mounted by soldering, wherein an insulating adhesive is applied between the plurality of electrical components.

2. A high-frequency module including a substrate with a component bearing surface on which electrical components are mounted by soldering, and a conductive cap for electromagnetically shielding the substrate and the electrical components from each other, wherein an insulating adhesive is applied on the substrate between the electrical components.

3. The high-frequency module as set forth in claim 2, wherein said insulating adhesive is also used to fix the electrical components adjacent to one another.

4. The high-frequency module as set forth in claim 2, wherein the insulating adhesive has such heat curable characteristics that the insulating adhesive is not cured in a pre-heat zone of a reflow vessel, and is cured in a reflow zone of the reflow vessel.

5. The high-frequency module as set forth in claim 2, wherein a corner depression of an arc shape is provided for each of four corners of the substrate, and a side depression of an arc shape is provided for each side of the substrate, and when viewed from front, the corner depression is in the form of a sector with a central angle in the vicinity of 90°, and the side depression is substantially a semi-circle, and a radius of the arc of the corner depression is larger than that of the side depression.

6. The high-frequency module as set forth in claim 2, wherein, with respect to a connecting surface of an electrode of the electrical components, which is a surface corresponding to the component bearing surface, an electrode connecting land which is formed on the component bearing surface and connected to the connecting surface is made smaller in size.

7. A high-frequency module including a substrate, rectangular in shape, with a component bearing surface on which electrical components are mounted by soldering, and a conductive cap for electromagnetically shielding the substrate and the electrical components from each other, the cap being made up of side walls respectively corresponding to four sides of the substrate, and a ceiling and an opened bottom, wherein said cap is soldered at lower end portions of the side walls to ground electrodes which are formed on the component bearing surface, and the ground electrodes are longer in length than the lower end portions in a direction along the lower end portions of the side walls, and an insulating adhesive is applied to respective ends of the ground electrodes.

8. A high-frequency module including a substrate, rectangular in shape, with a component bearing surface on which electrical components are mounted by soldering, and a conductive cap for electromagnetically shielding the substrate and the electrical components from each other, the cap being made up of side walls respectively corresponding to four sides of the substrate, and a ceiling and an opened bottom, wherein said cap is soldered at lower end portions of the side walls to ground electrodes which are formed on the component bearing surface, wherein the ground electrodes are shorter in length than the shorter end portions of the sidewalls, and the insulating adhesive is applied to areas of extensions of the ground electrodes in their lengthwise directions and in the vicinity of the respective ends of the ground electrodes.

9. The high-frequency module as set forth in claim 8, wherein the insulating adhesive is also used to fix the electrical components.

10. The high-frequency module as set forth in claim 8, wherein the lower end portions of a pair of opposing side walls respectively have flat portions parallel to the component bearing surface, and shapes of the flat portions are symmetrical to each other.

11. The high-frequency module as set forth in claim 8, wherein the lower end portions of the side walls are soldered to the ground electrodes, and, when viewed from front, the cap is smaller in size than the substrate, and a width of each of the ground electrodes is wider than two times a thickness of each side wall.

12. The high-frequency module as set forth in claim 8, wherein the lower end portions of at least the four side walls are connected to the ground electrodes.

13. The high-frequency module as set forth in claim 8, wherein end portions of the side walls have cut-out portions.

14. The high-frequency module as set forth in claim 8, wherein a resist is formed on the component bearing surface of the substrate, and the cap is soldered via non-resist portions to pattern lands which become the ground electrodes, and shapes of the non-resist portions are symmetrical to each other in a pair of pattern lands which become the ground electrodes corresponding to a pair of opposing side walls, respectively.

15. The high-frequency module as set forth in claim 8, wherein a Pb-free solder is used for soldering the electrical components and the cap.

16. A high-frequency module including a substrate, rectangular in shape, with a component bearing surface on which electrical components are mounted by soldering, and a conductive cap for electromagnetically shielding the substrate and the electrical components from each other, the cap being made up of side walls respectively corresponding to four sides of the substrate, and a ceiling and an opened bottom, wherein said cap is soldered at lower end portions of the side walls to ground electrodes which are formed on the component bearing surface, wherein the ground electrodes are shorter in length than the shorter end portions of the sidewalls, and the insulating adhesive is applied to areas of extensions of the ground electrodes in their lengthwise directions and in the vicinity of the respective ends of the ground electrodes, and wherein the ground electrodes are each divided into two parts with a non-electrode portion therebetween in a direction along the lower end portions of the side walls, and the insulating adhesive is applied to the non-electrode portion.

* * * * *